(12) United States Patent
Sechen et al.

(10) Patent No.: US 10,511,308 B2
(45) Date of Patent: Dec. 17, 2019

(54) FIELD PROGRAMMABLE TRANSISTOR ARRAYS

(71) Applicant: Board of Regents, The University of Texas System, Austin, TX (US)

(72) Inventors: Carl Sechen, Allen, TX (US); Georgios Makris, Dallas, TX (US); Gaurav Rajavendra Reddy, Dallas, TX (US); Jingxiang Tian, Richardson, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/937,355

(22) Filed: Mar. 27, 2018

(65) Prior Publication Data
US 2019/0103873 A1    Apr. 4, 2019

Related U.S. Application Data

(60) Provisional application No. 62/477,144, filed on Mar. 27, 2017.

(51) Int. Cl.
| | |
|---|---|
| *G06F 7/38* | (2006.01) |
| *H03K 19/173* | (2006.01) |
| *G06F 17/50* | (2006.01) |
| *H01L 27/02* | (2006.01) |

(52) U.S. Cl.
CPC ... *H03K 19/17744* (2013.01); *G06F 17/5077* (2013.01); *H01L 27/0207* (2013.01); *H03K 19/1776* (2013.01); *H03K 19/17724* (2013.01); *H03K 19/17772* (2013.01)

(58) Field of Classification Search
USPC .............................................. 326/44–45, 49
See application file for complete search history.

(56) References Cited

U.S. PATENT DOCUMENTS

| 7,342,415 B2 | 3/2008 | Teig et al. | |
|---|---|---|---|
| 2002/0027446 A1* | 3/2002 | Barnes | H01L 27/0629 326/44 |
| 2014/0292369 A1* | 10/2014 | Trefzer | H03K 19/17748 326/41 |

OTHER PUBLICATIONS

Hoyer et al., "Locally Clocked Pipelines and Dynamic Logic," IEEE Transactions on Very Large Scale Integration (VLSI) Systems, vol. 10, No. 1, Feb. 2001, pp. 58-62.

* cited by examiner

*Primary Examiner* — Anh Q Tran
(74) *Attorney, Agent, or Firm* — Yee & Associates, P.C.

(57) ABSTRACT

Illustrative embodiments provide a field-programmable transistor array and a method of making an integrated circuit comprising a field-programmable transistor array. The field-programmable transistor array comprises a plurality of logic cells. Each of the plurality of logic cells comprises a plurality of columns of transistors. Each of the plurality of columns of transistors comprises a plurality of first transistors and a plurality of second transistors. Each of the plurality of first transistors are individually programmable to be either always on, always off, or to be controlled by a logic signal to be on or off. Each of the plurality of second transistors are configured to be programmed to be always on or always off.

17 Claims, 18 Drawing Sheets

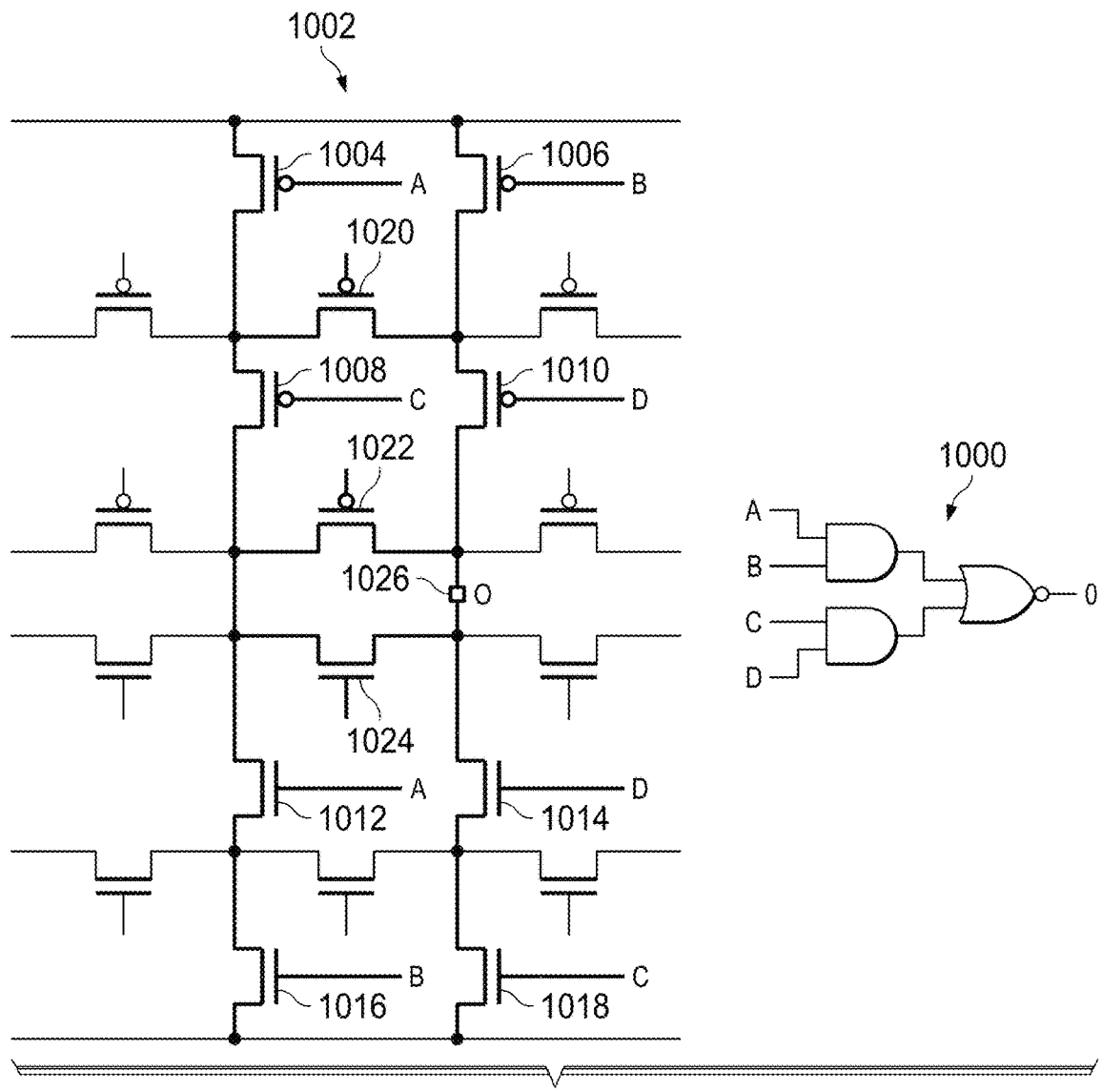
FIG. 10
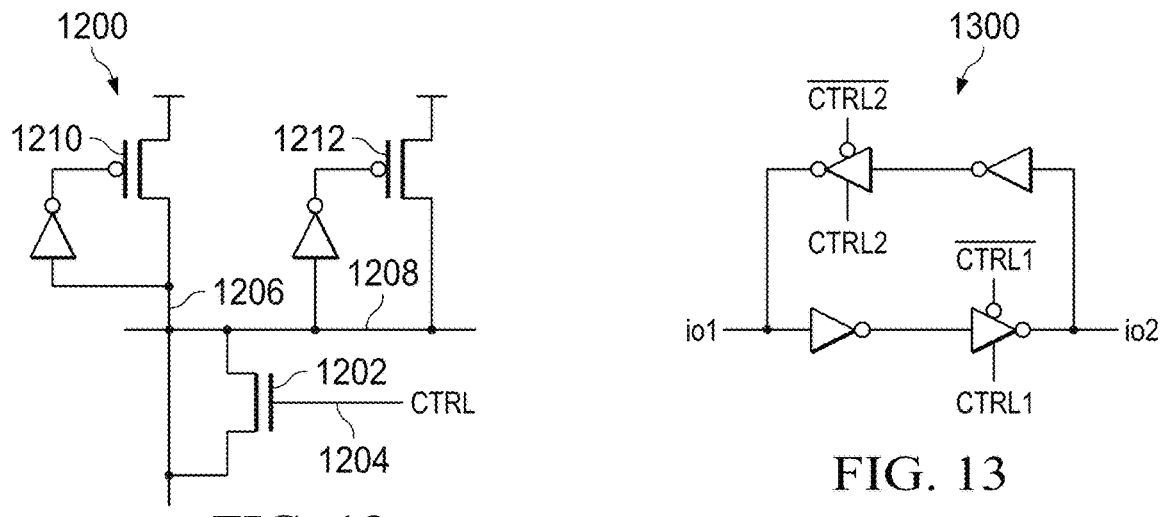
FIG. 12
FIG. 13

FIELD PROGRAMMABLE TRANSISTOR ARRAYS

This application claims the benefit of U.S. Provisional Patent Application No. 62/477,144, filed Mar. 27, 2017, entitled "Field Programmable Transistor Arrays", the entirety of which is incorporated herein by reference.

BACKGROUND INFORMATION

1. Field

The present disclosure relates generally to integrated circuits. More particularly, the present disclosure relates to programmable integrated circuits that are designed to be configured after manufacturing.

2. Background

Field-programmable integrated circuits are designed to be configured after manufacturing. Field-programmable integrated circuits have many known applications and uses. For example, field-programmable integrated circuits may be used for prototyping more conventional integrated circuits that are configured during manufacturing. For example, without limitation, system on a chip (SoC) and application-specific integrated circuit (ASIC) designs may be prototyped on field-programmable integrated circuits for hardware verification and early software development. As another example, field-programmable integrated circuits may be used for applications where the volume of production is small. For such low-volume applications, the premium in hardware cost per unit for a programmable integrated circuit chip may be more affordable than the development resources spent on creating an ASIC A field-programmable gate array (FPGA) is an example of a field-programmable integrated circuit. An FPGA contains an array of programmable logic blocks and a hierarchy of reconfigurable interconnects that allow the logic blocks to be connected together in different configurations. The logic blocks in an FPGA may be configured to implement simple logic gates or to perform complex combinational functions. The basic configurable logic blocs (CLBs) in an FPGA employ look-up tables (LUTs) to generate combinational logic functions. The logic blocks in an FPGA may also include memory elements, which may be simple flip-flops or more complete blocks of memory.

The programmable flexibility of an FPGA requires many long wires to be pre-fabricated with many options for how the wires may be interconnected. The amount of wiring is several tens of times more than for an ASIC. As a consequence, the size of a digital system that can be implemented on an FPGA is several tens of times smaller than what can be implemented on an ASIC. Furthermore, the power consumption for a digital system implemented on an FPGA may be several tens of times larger than for the same digital system implemented on an ASIC. Nonetheless, FPGAs are widely and increasingly being used due to the fact that digital systems may be implemented in hours or days using FPGAs, compared to many months for implementing digital systems on ASICs.

FPGA's and other current field-programmable integrated circuits have various limitations. These limitations may limit the usefulness of current field-programmable integrated circuits for various applications.

Therefore, there may be a need for an apparatus and method that take into account at least some of the issues discussed above, as well as other possible issues.

SUMMARY

The illustrative embodiments provide a field-programmable transistor array. The field-programmable transistor array comprises a plurality of logic cells. Each of the plurality of logic cells comprises a plurality of columns of transistors. Each of the plurality of columns of transistors comprises a plurality of first transistors and a plurality of second transistors. Each of the plurality of first transistors are individually programmable to be either always on, always off, or to be controlled by a logic signal to be on or off. Each of the plurality of second transistors are configured to be programmed to be always on or always off.

Illustrative embodiments also provide a method of making an integrated circuit. An integrated circuit comprising standard logic cells that are configured during manufacturing and a field-programmable transistor array is manufactured. The field-programmable transistor array is configured after manufacturing to configure the integrated circuit as a whole.

Other variations are possible, as described below.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 10 is a schematic illustration of a logic cell configured to implement an AND-OR-INVERT (AOI22) gate in a field-programmable transistor array in accordance with an illustrative embodiment;

FIG. 12 is a schematic illustration of a switch for a routing switch block for a logic cell in a field-programmable transistor array in accordance with an illustrative embodiment;

FIG. 13 is a schematic illustration of a bi-directional repeater for a field-programmable transistor array in accordance with an illustrative embodiment;

DETAILED DESCRIPTION

Figure 1:
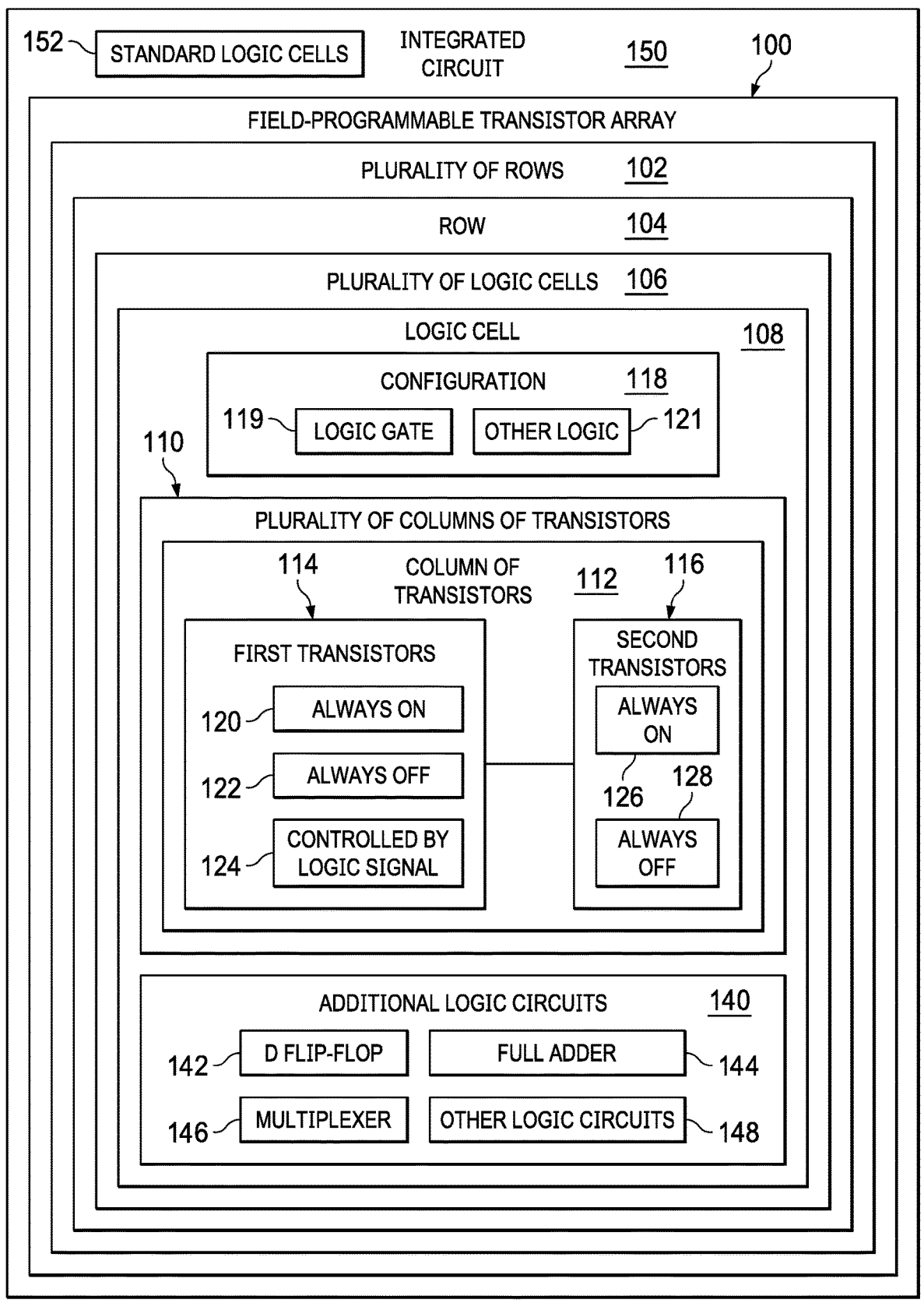
FIG. 1 is a block diagram of a field-programmable transistor array in accordance with an illustrative embodiment.

The illustrative embodiments recognize and take into account a variety of considerations. For example, the illustrative embodiments recognize and take into account that, due to the poor logic density provided by current FPGAs, systems being implemented on FPGAs increasingly demand a capacity that may only be provided by the very latest technology. These state-of-the-art FPGA devices may be extremely expensive. Also, some of digital systems may be so large that they may require the use of multiple such state-of-the-art FPGA devices implemented on a printed circuit board.

Since the logic density is so poor in FPGAs, and consequently the wires are so long, power consumption is overwhelmingly dominated by the wires. Standard design and synthesis procedures exacerbate the problem by providing various functional units (of both large and small scale) and then having to repeatedly ship data over extremely long wires to shuttle that data between the various functional units. The power consumed by this shuttling of data between the functional units over long wires is by far the dominant source of power consumption.

Illustrative embodiments also recognize and take into account that contemporary semiconductor manufacturing largely follows a fabless business model in which third-party foundries are provided with the source files for an integrated circuit design, such as in GDSII or another appropriate format, and are contracted to fabricate it. This fabless model may incur an inherent security and trustworthiness risk. The entire intellectual property (IP) of an integrated circuit design is exposed to a potentially untrustworthy foundry or any rogue element therein and is, therefore, subject to malicious manipulation and/or theft. As a result, protecting sensitive parts of the design (e.g., trade secrets, classified data/algorithms, competitive advantage circuits, etc.) and ensuring functional integrity of the received ICs becomes very challenging. Furthermore, such security and trust concerns continue to exist after an IC is deployed in the field of operation. Indeed, reverse engineering may still reveal the secret IP contained in an IC, while dormant malicious logic may be activated post-deployment in order to compromise functional integrity of the IC.

Accordingly, the semiconductor industry is in need of solutions to protect integrated circuit designs, or portions thereof, from being stolen or maliciously modified by an untrustworthy foundry. Solutions also may be needed to protect integrated circuit designs, or portions thereof, from being stolen by an unauthorized user of a fabricated integrate circuit. Solutions also may be needed to detect malicious functionality when an integrated circuit is activated in the field of operation.

Illustrative embodiments provide a field-programmable transistor array comprising an arrangement of transistors which can be individually configured and appropriately interconnected in order to implement a desired digital circuit. A field-programmable transistor array in accordance with an illustrative embodiment may be implemented using conventional static complementary metal-oxide-semiconductor (CMOS). The novel reconfigurable architecture of a field-programmable transistor array in accordance with an illustrative embodiment provides several highly-desirable features. In particular, a field-programmable transistor array in accordance with an illustrative embodiment has significant differences and potential advantages over FPGAs.

Unlike the basic CLBs of an FPGA, which employs LUTs to generate combinational logic functions, a field-programmable transistor array in accordance with an illustrative embodiment comprises a configurable array of transistors which can be interconnected to implement standard library cells. An FPGA may allocate an entire LUT to implement even a relatively simple gate. In contrast, a field-programmable transistor array in accordance with an illustrative embodiment may allocate only the number of columns of transistors required. Therefore, transistor utilization may be higher in a field-programmable transistor array in accordance with an illustrative embodiment than in FPGA LUTs.

In accordance with an illustrative embodiment, programming for multiple different configurations of a field-programmable transistor array may be stored at the same time in local memory along with the computational state of each configuration. This programming may be used to change the configuration of the field-programmable transistor array dynamically within a fraction of a clock cycle, while retaining the computational state of the array. Furthermore, programming for a new configuration may be loaded into local memory while the configuration of the field-programmable transistor array is changed.

Illustrative embodiments support chip-level virtualization and board-level virtualization by a field-programmable transistor array. By chip-level virtualization, a field-programmable transistor array in accordance with an illustrative embodiment can implement a design that is much larger than its physical size. For example, without limitation, a field-programmable transistor array in accordance with an illustrative embodiment can implement a design that is larger than the physical field-programmable transistor array by a factor equal to a number of different configurations of the field-programmable transistor array. By board-level virtualization, a field-programmable transistor array in accordance with an illustrative embodiment can implement multiple separate designs for effectively simultaneous operation that would otherwise require multiple programmable chips. For example, without limitation, a field-programmable transistor array in accordance with an illustrative embodiment may implement effectively simultaneous operation of a number of distinct digital designs equal to a number of different configurations of the field-programmable transistor array. Illustrative embodiments may implement both chip-level virtualization and board level virtualization in a field-programmable transistor array, thereby greatly lowering board design costs.

Instead of being serially loaded, illustrative embodiments provide for the rapid partial or full modification of a stored configuration in a time proportional to the number of modified configuration bits through the use of hierarchically arranged, high throughput, asynchronously pipelined memory buffers. This method of modifying a configuration enables not only faster configuration but also rapid dynamic partial configuration wherein only a portion of a circuit is reloaded by addressing specific transistor columns.

Illustrative embodiments also provide support for libraries containing cells of the same height and variable width, just as in a typical standard cell circuit, thereby simplifying transition from a field-programmable transistor array used as a prototype to a custom integrated circuit design.

A field-programmable transistor array may be co-designed along with conventional standard cell digital logic on an ASIC. The same synthesis, placement and timing analysis tools may be used for both the field-programmable transistor array and conventional standard cell digital logic portions of the ASIC. The integration of field-programmable transistor arrays in accordance with an illustrative embodiment together with conventional ASIC logic enables effective design obfuscation, because only the end user of the chip knows and determines the functionality of the field-programmable transistor array blocks.

Illustrative embodiments also address both intellectual property protection and design integrity concerns. Sensitive parts of a design may be replaced with a field-programmable transistor array. After the chips are fabricated and received from the foundry, the withheld portions of the design are programmed by appropriately configuring the transistors in the field-programmable transistor array into logic gates, memory elements, and interconnects, as well as connecting them with the custom-designed portions of the circuit to complete the IC functionality.

Turning to FIG. 1, a block diagram of a field-programmable transistor array is depicted in accordance with an illustrative embodiment. Field-programmable transistor array 100 is configured to support transistor-level programming.

Field-programmable transistor array 100 may comprise plurality of programmable logic cells 106. Each logic cell 108 in plurality of logic cells 106 may be programmed to a desired configuration 118 to implement logic gate 119 or other logic 121.

One embodiment of field-programmable transistor array 100 comprises plurality of rows 102 of transistors. Each row 104 in plurality of rows 102 may comprise plurality of logic cells 106. This example architecture for field-programmable transistor array 100 resembles a standard cell circuit. Therefore, field-programmable transistor array 100 may work with cell libraries similar to those used for a typical standard cell-based ASIC, where each cell has the same height and variable width.

Each logic cell 108 in plurality of logic cells 106 comprises plurality of columns of transistors 110. In field-programmable transistor array 100, the granularity of the width of logic cell 108 is one column of transistors 112. For example, without limitation, logic cell 108 may comprise a group of four columns of transistors or any other appropriate number of columns of transistors.

Column of transistors 112 comprises first transistors 114 and second transistors 116. The basic structure of each column of transistors 112 may be replicated repeatedly to form row 104 of plurality of columns of transistors 110 with plurality of columns of transistors 110 in row 104 connected in parallel. For example, without limitation, first transistors 114 may comprise two pMOS transistors connected in series with each other and connected in series with two nMOS transistors connected in series with each other. Second transistors 116 may comprise two pMOS transistors connecting the two pMOS transistors in first transistors 114 of one column of transistors 112 with the two pMOS transistors in first transistors 114 in the next column of transistors 112 in row 104 and two nMOS transistors connecting the two nMOS transistors in first transistors 114 of the one column of transistors 112 with the two nMOS transistors in first transistors 114 in the next column of transistors 112 in row 104.

First transistors 114 and second transistors 116 are programmable to implement configuration 118 of logic cell 108. For example, each of first transistors 114 is independently programmable to be always on 120, always off 122, or to receive a logic signal such that the state of the transistor is controlled by the logic signal 124. Each of second transistors 116 is independently programmable to be always on 126 or always off 128. A number of second transistors 116 also may be programmable to receive a logic signal such that the state of the transistor is controlled by logic signal 124.

In addition to plurality of columns of transistors 110, each logic cell 108 in plurality of logic cells 106 may include one or more additional logic circuits 140. For example, without limitation, additional logic circuits 140 may include D flip-flop 142, full adder 144, multiplexer 146, any other appropriate logic circuit 148, or various combinations of appropriate logic circuits. The inputs and outputs of additional logic circuits 140 in logic cell 108 may optionally be connected to inputs and outputs of logic cell 108.

Field-programmable transistor array 100 may be manufactured as part of integrated circuit 150 along with standard logic cells 152. Standard logic cells 152 are configured during manufacturing. Field-programmable transistor array 100 may be configured after manufacturing such that integrated circuit 150 as a whole is configured after manufacturing.

Unlike FPGA-style solutions, the proposed transistor-level programmable fabric can be seamlessly integrated into the typical commercial CAD flow with only minimal changes in the routing and programming generation phases.

The key enabler here is that the logic gates and/or memory elements that are programmed on the transistor-level fabric consist of exactly the same cells as in a standard library cell (albeit with different performance characteristics). Therefore, logic synthesis, verification and timing analysis can be seamlessly performed across the custom and programmable portions of the design. Once the programmable portions are annotated, a customized commercial placer tool and a custom router can be used to finalize the layout and produce the GDSII to be sent to the foundry. The same flow also produces automatically the bit-stream which will be used to program the transistor-level fabric once the chips are received from the foundry.

The program necessary for configuring the transistor-level fabric can be stored either in non-volatile or in volatile memory. The former is preferred when there is no concern about trustworthiness of the end IC user. In this case, using one-time programmable (OTP) memory directly connected to the fabric completes and finalizes the design. The latter is preferred when one seeks to protect the program from being extracted from the IC by an unauthorized user. In this case, the program can be stored in encrypted form in a separate non-volatile memory (either on-die or off-die). An on-die decryption engine can then be used along with a user-provided key to decrypt the program and bootstrap the design at power on. In this way, the actual program is never exposed to an unauthorized IC user.

The transistor-level programmable fabric is able to instantiate not only combinational logic gates but also latches, multiplexers and flip-flops. This, in turn, makes it even more difficult for the attacker to guess the functionality that will be eventually programmed on this sea of transistors, as it spans the time domain. In other words, by hiding the circuitry that will be programmed on the transistor-level fabric, we can concurrently obfuscate logic and state space.

An additional feature of the transistor-level programmable fabric is that it supports co-existence of multiple programs, switching among which is possible within a fraction of a clock cycle. In other words, the same programmable transistors can be used for implementing different logic functions and/or finite state machines at different phases of an algorithm, which can be as short as a single clock cycle. Multiple programs are then stored and time-share the programmable fabric by dynamically switching between them as required by the algorithm implemented by the IC. This not only reduces overhead of the proposed solution but also makes it even more difficult for an attacker to guess the functionality that will be programmed on the transistor-level fabric, as it can differ across algorithm phases.

Similar to other circuit obfuscation technologies, the transistor-level programming approach incurs various types of overhead. In terms of design time, the overhead is negligible: as long as a decision is made as to what parts of the functionality to hide, the rest of the process is fully automatable within the typical CAD tool flows, with the addition of custom back-end routing capabilities. In terms of area, performance, and power consumption, the programmable portion of the fabric will, indeed, impose added demands. We emphasize, however, that such overhead is not of the order of magnitude that an FPGA-style solution would incur. If judiciously distributed throughout the design, the transistor-level programmable fabric will not require extensive programmable interconnect (which dominates area, power and delay in an FPGA). Instead, it will comprise local islands (e.g., of hundreds or thousands of gates) of the reconfigurable fabric, customized and optimized to support the design that will be eventually programmed on it with minimal overhead. Furthermore, by leveraging the virtualization and time-sharing capabilities of our programmable fabric, we can further reduce the real estate required for implementing a circuit. Overall, we strongly believe that the overhead incurred by this solution will be very reasonable and will grow linearly with the percentage of the design that one wishes to withhold from the foundry.

Successful development and deployment of the proposed transistor-level programming solution will facilitate cost-effective solutions for the four security and trust concerns outlined previously. More specifically, below we describe how transistor-level programming can achieve each of the four objectives:

Protecting a design (or portions thereof) from being stolen by an untrusted foundry: As parts of the design are withheld from the foundry, and as the hidden circuit corresponds to both logic and state and can dynamically change during different phases of the algorithm, it is extremely difficult for an attacker at the foundry to guess the missing functionality.

Protecting a design (or portions thereof) from being stolen by an unauthorized user of a fabricated IC: Either by removing the program from the IC at power-off or by storing it in encrypted form on an on-chip non-volatile memory and decrypting it with an authorized user-provided key at power-on, this approach prevents an unauthorized user of the IC from extracting the program and obtaining the secret IP.

Preventing a design from being maliciously modified by an untrusted foundry: The proposed solution prevents malicious design modification and hardware Trojan insertion in two ways. First, with the design being only partially available to the attacker, it is difficult to introduce meaningful Trojans. Second, and most importantly, the transistor-level programmable fabric can be used as a temporary scratchpad on which duplicates of the custom-designed portions of the circuit (possibly operating at slower speed) can be implemented. Careful partitioning of the logic and successive application of appropriately selected test patterns can exhaustively verify functionality integrity of each partition through duplication and comparison.

Detecting malicious functionality when activated in the field of operation: The transistor-level programmable fabric can be used not only for implementing parts of the IC functionality after fabrication but also for implementing on-line monitoring schemes. Specifically, combinational or sequential assertions which cover the most critical functionality of the design can be synthesized and implemented on the programmable fabric. Any activation of dormant malicious logic that violates these assertions will trigger the monitoring logic and will result in detection. Importantly, the adversary implanting the malicious logic at the foundry is unaware of what assertions will be eventually implemented or what they will be checking, so he/she cannot pre-emptively evade them.

Figure 2:
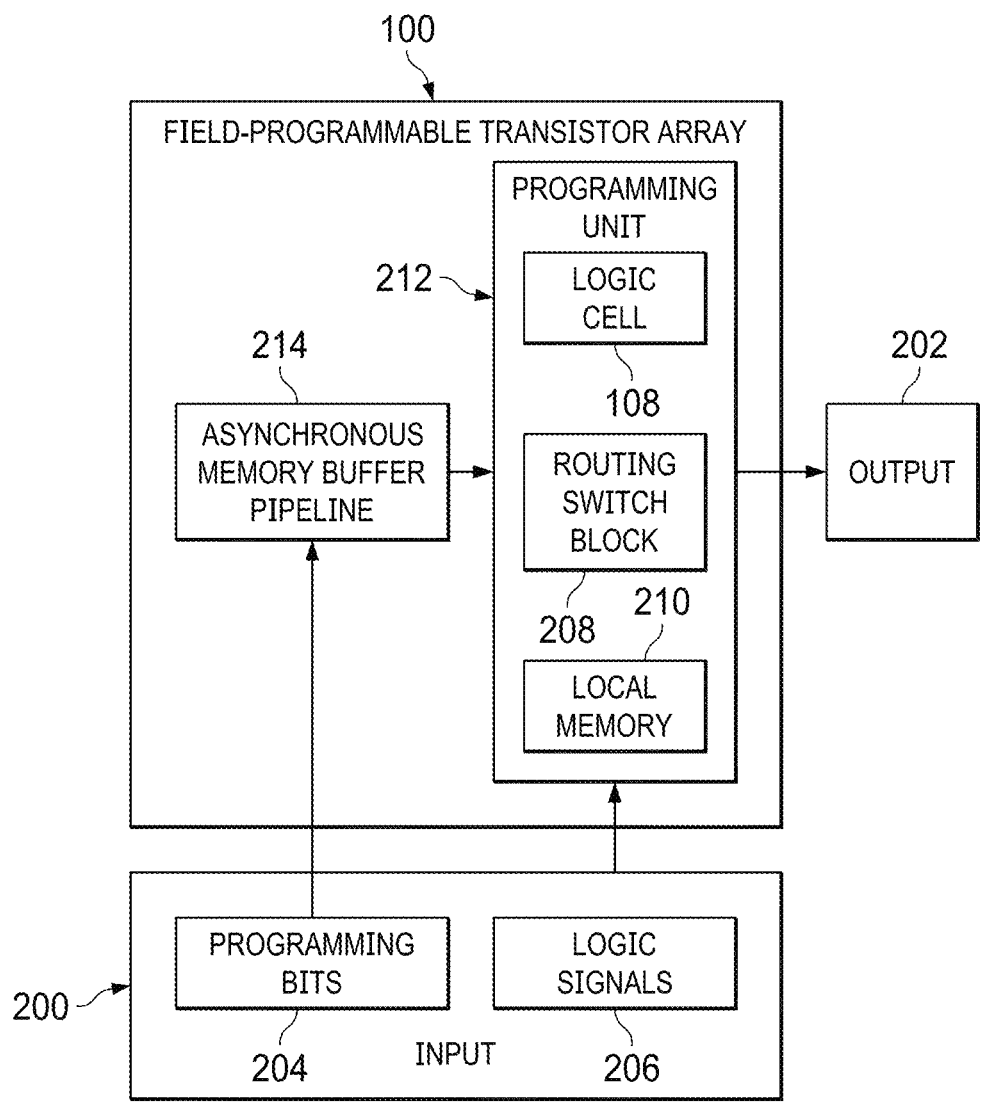
FIG. 2 is a block diagram of routing and programming architecture for a field-programmable transistor array in accordance with an illustrative embodiment.

Turning to FIG. 2, a block diagram of routing and programming architecture for a field-programmable transistor array is depicted in accordance with an illustrative embodiment. Field-programmable transistor array 100 is configured to receive input 200 and to provide output 202.

In accordance with an illustrative embodiment, input 200 may comprise programming bits 204 and logic signals 206. Programming bits 204 are used to program logic cells in field-programmable transistor array 100. For example, input 200 may be routed to each logic cell 108 and output may be routed from each logic cell via routing switch block 208.

Routing switch block 208 along with local memory 210 for logic cell 108 may form programming unit 212. Asynchronous memory buffer pipeline 214 may be used to load programming bits 204 into local memory 210 in an efficient manner, as will be described in more detail below. The structure of local memory 210 can support single-cycle switching between multiple configurations.

In accordance with an illustrative embodiment, each logic cell 108 in field-programmable transistor array 100 may include two routing switch blocks, one just above the logic cell and one just below the logic cell. It is more efficient to supply the programming bits for the top part of the logic cell (pMOS transistors) from above, and for the bottom part of the logic cell (nMOS transistors) from below. The upper and lower pair of switchboxes belonging to vertically neighboring logic cells can be viewed as a single routing switch block 208.

We seek to greatly reduce power consumption of field programmable devices and to greatly increase the size of systems that can be implemented on a field programmable device. Toward this end we propose a field-programmable transistor array (FPTA) that we have shown to be more area efficient in implementing digital logic than the conventional look-up tables used in the leading commercial FPGAs. Then, instead of storing one programming bit for each configuration option in the FPTA, we propose storing a set of programming bits (e.g., 4, 8, 16, etc.) for each configuration option. A transition from one set of programming bits to another set is fast, taking less than one clock cycle.

This feature enables the FPTA to implement two different types of virtualization, on the same FPTA chip. The first type is termed chip virtualization and the second type is board virtualization.

Chip virtualization introduces the concept of a virtual, layered FPTA. Each layer implements a portion of a system. Consider the example of four layers, A, B, C and D. Suppose layer A is executed first, and when its computation is complete, the results are locally stored in registers. If layer B is to be executed next, then its corresponding set of programming bits are snapped into active mode (in less than a clock cycle). Layer B then utilizes the results that layer A left deposited in registers and completes its execution, locally storing its results in registers. If layer C is to be executed next, then its corresponding set of programming bits are snapped into active mode. Layer C then utilizes the results that layer B left deposited in registers and completes its execution, and so forth.

This virtual, layered FPTA can implement a system that is 4, 8 or 16 (or more) times larger than the largest system that could fit in one physical FPTA (or FPGA). A system designer could therefore choose a much cheaper, older technology FPGA to implement his system that would otherwise demand the capacity of a state-of-the-art (very expensive) FPGA. On the other hand, state-of-the-art FPGAs could be used to implement system complexities that would be far beyond the capacity of a single state-of-the-art FPGA, avoiding the need for very expensive PCBs that contain an array of such state-of-the-art FPGAs.

In this first way, the set of layers operate interdependently. A digital system whose logic gate content exceeds the capacity of the inherent FPTA, or equivalently, exceeds the capacity of a single layer of the FPTA, can nonetheless be implemented on the FPTA as long as the number of layers times the capacity of the FPTA is not less than the digital system's logic gate content. In this mode of operation, two or more layers are executed in a certain order.

In conventional (current) FPGAs, moving data between functional units consumes roughly 99% of the power. Instead, for our chip virtualization approach (the virtual, layered FPTA), we move the functional units (by switching from one active layer to another) and largely avoid moving the data, reducing power by one or two orders of magnitude. When the functional units are done computing, we locally store the data. Then the process repeats, where we again instantiate new functional units that will use the previously stored data. In the FPTA, instantiating new functional units is accomplished by switching layers.

Each potential gate output in a logic cell has means (namely a flip-flop) to retain its output value to facilitate the switch to another layer. That is, upon completing execution of a layer, all actual gate outputs are simultaneously captured by retention flip-flops (FFs). These retention FFs place their outputs onto vertical metal2 output lines which functional as primary inputs for the next layer to be executed.

Figure 3:
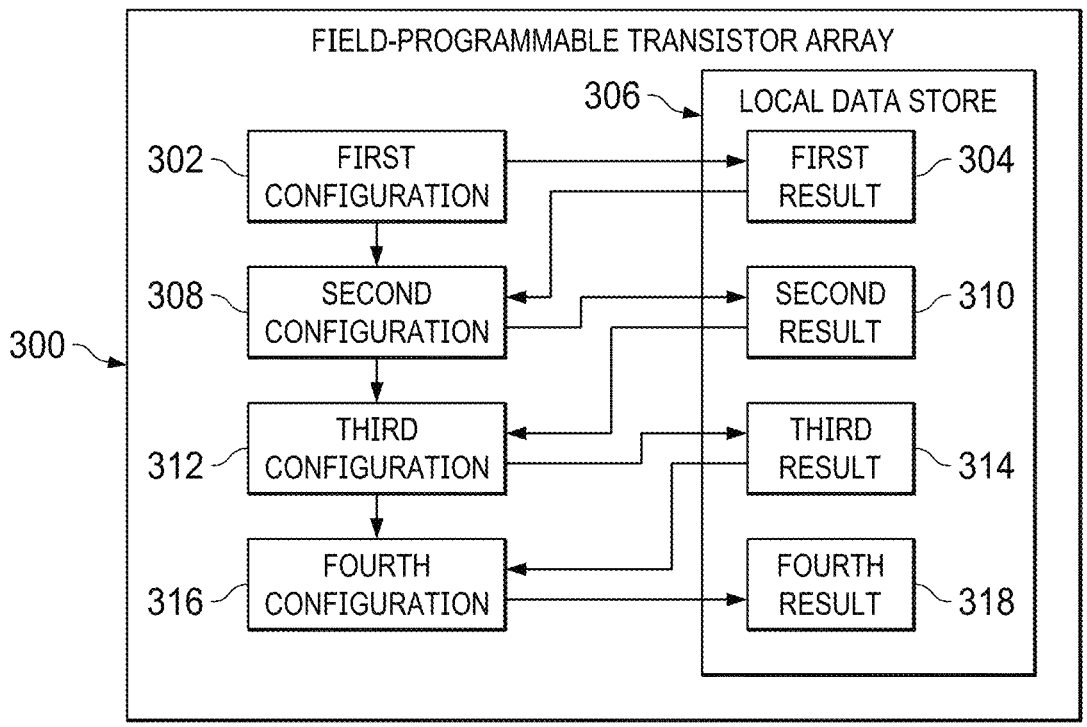
FIG. 3 is a block diagram of chip-level virtualization by a field-programmable transistor array in accordance with an illustrative embodiment.

Turning to FIG. 3, a block diagram of chip-level virtualization by a field-programmable transistor array is depicted in accordance with an illustrative embodiment. Field-programmable transistor array 300 may be an example of one implementation of field-programmable transistor array 100 in FIG. 1.

In this example, first configuration 302 of field-programmable transistor array 300 is run to obtain first result 304 which may be stored in local data store 306. Field-programmable transistor array 300 is reconfigured quickly, in one cycle or less, to second configuration 308 which is run using first result 304 to obtain second result 310. Field-programmable transistor array 300 is reconfigured quickly, in one cycle or less, to third configuration 312 which is run using second result 310 to obtain third result 314. Field-programmable transistor array 300 is reconfigured quickly, in one cycle or less, to fourth configuration 316 which is run using third result 314 to obtain fourth result 318. In this example, field-programmable transistor array 300 is thus used to implement circuitry for four configurations in the physical space of one configuration.

For board virtualization, the various layers in our FPTA each contain independent systems. A controller (which could be one of the layers) could execute one layer for a time, and then switch (in less than a clock cycle) to another independently operating layer for a time, and so forth. This operation mimics how central processing units (CPUs) swap software jobs into and out of the virtual memory in the CPU core. Digital systems that would otherwise require 4, 8, or 16 (or more) different FPGA chips on a board could now be implemented on a single FPTA, resulting in virtualization of the board.

In board virtualization, the set of layers in the FPTA operate largely independently. In other words, for a four-layer FPTA, four separate digital systems can be time-interleaved on the physical FPTA. This is similar to a central processing unit (CPU) which has software jobs swapped into and out of itself. A controller will select which system (layer) operates at any given time. Switching between layers takes less than a clock cycle. Furthermore, one of the layers can function as the controller. In other words, the FPTA is also able to reprogram other layers while running a particular layer.

Figure 4:
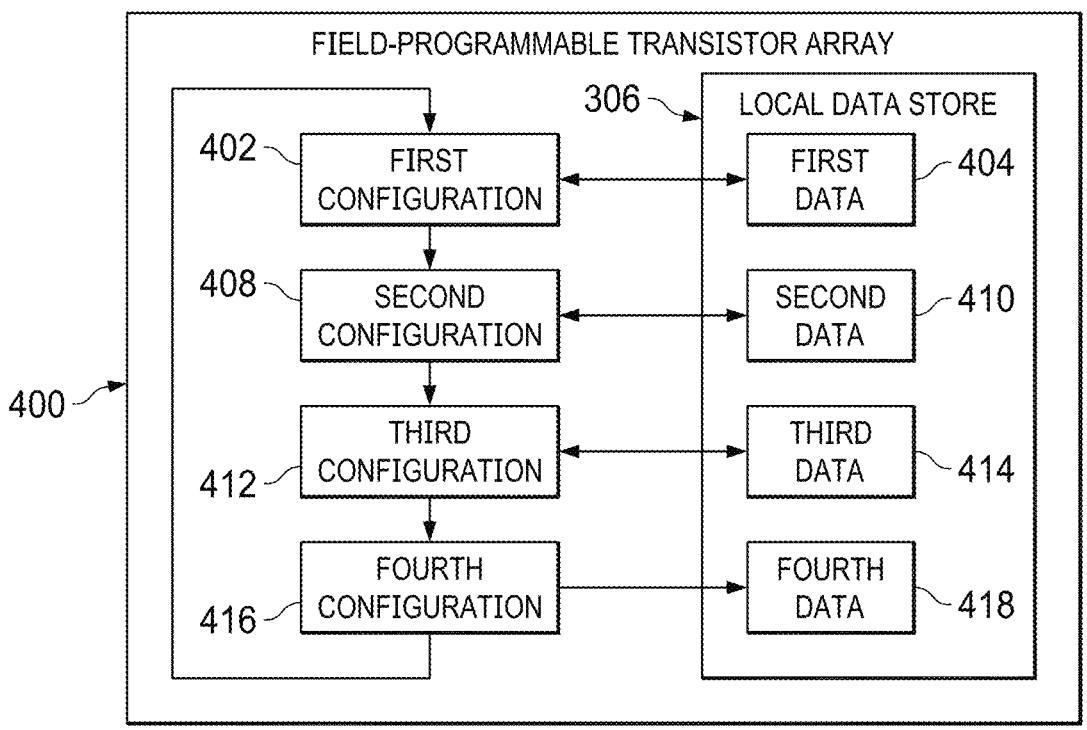
FIG. 4 is a block diagram of board-level virtualization by a field-programmable transistor array in accordance with an illustrative embodiment.

Turning to FIG. 4, a block diagram of board-level virtualization by a field-programmable transistor array is depicted in accordance with an illustrative embodiment. Field-programmable transistor array 400 may be an example of one implementation of field-programmable transistor array 100 in FIG. 1.

In this example, first configuration 402 of field-programmable transistor array 400 is run to process first data 404, which may be stored in local data store 306. After a certain amount of run time, running of first configuration 402 is stopped and field-programmable transistor array 400 is reconfigured quickly, in one cycle or less, to second configuration 408 which is run to process second data 410. After a certain amount of run time, running of second configuration 408 is stopped and field-programmable transistor array 400 is reconfigured quickly, in one cycle or less, to third configuration 412 which is run to process third data 414. After a certain amount of run time, running of third configuration 412 is stopped and field-programmable transistor array 400 is reconfigured quickly, in one cycle or less, to fourth configuration 416 which is run to process fourth data 418. After a certain amount of run time, running of fourth configuration 416 is stopped and field-programmable transistor array 400 is reconfigured quickly, in one cycle or less, back to first configuration 402 which is run to pick up processing of first data 404 again.

Our proposed FPTA is also able to reprogram other layers while running a particular layer. Loading new programming bits is very fast using our word-based asynchronous pipelining scheme which enables programming rates of more than 10 gigabits per second.

The new FPTA may be used in another way. The FPTA, when programmed, consists of rows of "standard" cells, characterized in the same manner as in an ASIC. This opens a new paradigm for a mixed programmable/fixed ASIC that would use a consistent set of synthesis, layout (routing) and timing/power verification tools. Both the standard ASIC portion and the FPTA portion would comprise rows of cells. All cells would be characterized in the standard liberty file (.lib) manner. A uniform approach to static timing analysis would be employed. This approach would greatly reduce power consumption for a programmable chip compared to using an FPGA for the whole system.

Figure 5:
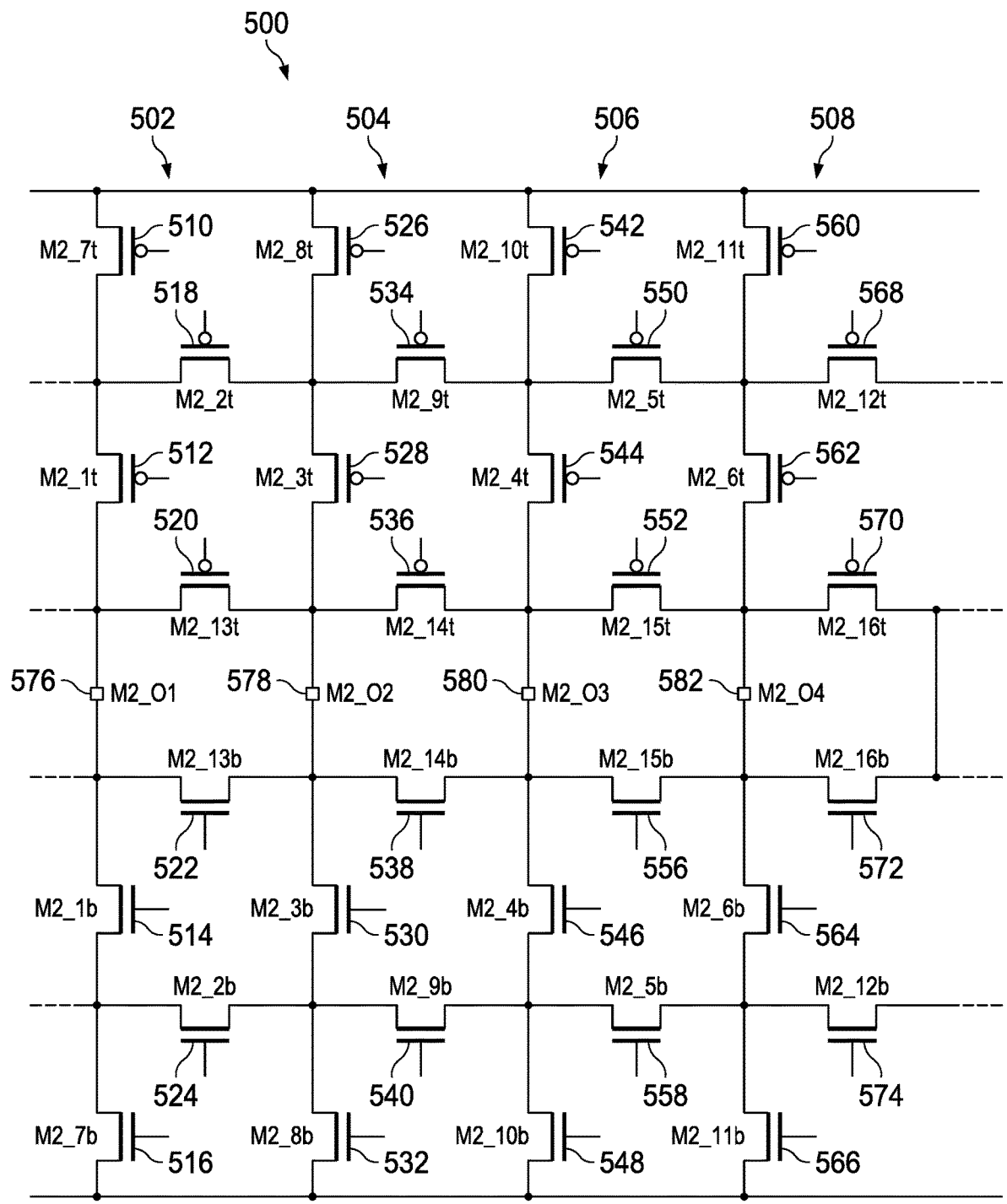
FIG. 5 is a schematic illustration of a logic cell structure for a field-programmable transistor array in accordance with an illustrative embodiment.

Turning to FIG. 5, a schematic illustration of a logic cell structure for a field-programmable transistor array is depicted in accordance with an illustrative embodiment. Logic cell 500 is an example of one implementation of logic cell 108 in FIG. 1. In this example embodiment, four columns of transistors are grouped together to form logic cell 500. Logic cell 500 comprises first column of transistors 502, second column of transistors 504, third column of transistors 506, and fourth column of transistors 508 connected in parallel. For example, without limitation, the metal1 (M1) layer may be used to interconnect the transistors and various logic gates in logic cell 500.

First transistors in first column of transistors 502 comprise pMOS transistor 510 and pMOS transistor 512 above nMOS transistor 514 and nMOS transistor 516. Second transistors in first column of transistors 502 comprise pMOS transistor 518, pMOS transistor 520, nMOS transistor 522, and nMOS transistor 524.

First transistors in second column of transistors 504 comprise pMOS transistor 526 and pMOS transistor 528 above nMOS transistor 530 and nMOS transistor 532. Second transistors in second column of transistors 504 comprise pMOS transistor 534, pMOS transistor 536, nMOS transistor 538, and nMOS transistor 540.

First transistors in third column of transistors 506 comprise pMOS transistor 542 and pMOS transistor 544 above nMOS transistor 546 and nMOS transistor 548. Second transistors in third column of transistors 506 comprise pMOS transistor 550, pMOS transistor 552, nMOS transistor 556, and nMOS transistor 558.

First transistors in fourth column of transistors 508 comprise pMOS transistor 560 and pMOS transistor 562 above nMOS transistor 564 and nMOS transistor 566. Second transistors in fourth column of transistors 508 comprise pMOS transistor 568, pMOS transistor 570, nMOS transistor 572, and nMOS transistor 574.

Each of first transistors 510, 512, 514, 516, 526, 528, 530, 532, 542, 544, 546, 548, 560, 562, 564, and 566 can be programmed to be always on, always off, or to receive a logic signal such that the state of the transistor is controlled by the logic signal. Each of second transistors 518, 520, 522, 524, 534, 536, 538, 540, 550, 552, 556, 558, 568, 570, 572, and 574 can be programmed to be always on or always off. Second transistors 520, 522, 536, 538, 552, 556, 570, and 572 may be used strictly for isolation. Second transistors 518, 524, 534, 540, 550, 558, 568, and 574 may not only support isolation but also enable the use of logic functions that require up to three transistors in series.

A potential logic gate output is illustrated at points 576, 578, 580, and 582 in logic cell 500. Each potential output 576, 578, 580, and 582 may optionally be connected to a vertical metal2 (M2) track by a programmed switch. In addition, first transistors 510, 512, 514, 516, 526, 528, 530, 532, 542, 544, 546, 548, 560, 562, 564, and 566 may be directly connected to individual vertical M2 tracks. Each of these tracks is driven by either a programming bit or a logic signal.

In the example embodiment logic cell 500, a pull-down (or pull-up) network of three transistors in series is the maximum possible. The limitation to three transistors in series may be based on area efficiency versus power efficiency concerns. It has been shown that a standard cell library limited to two transistors in series for each of the pull-up and pull-down networks may be sufficient to generate circuits with the best power efficiency. However, for FPGAs, the vast majority of the delay and power are due to the interconnection networks. Therefore, it may be desirable to reduce the number of nets by allowing more complex cells with up to three transistors in series.

Figure 6:
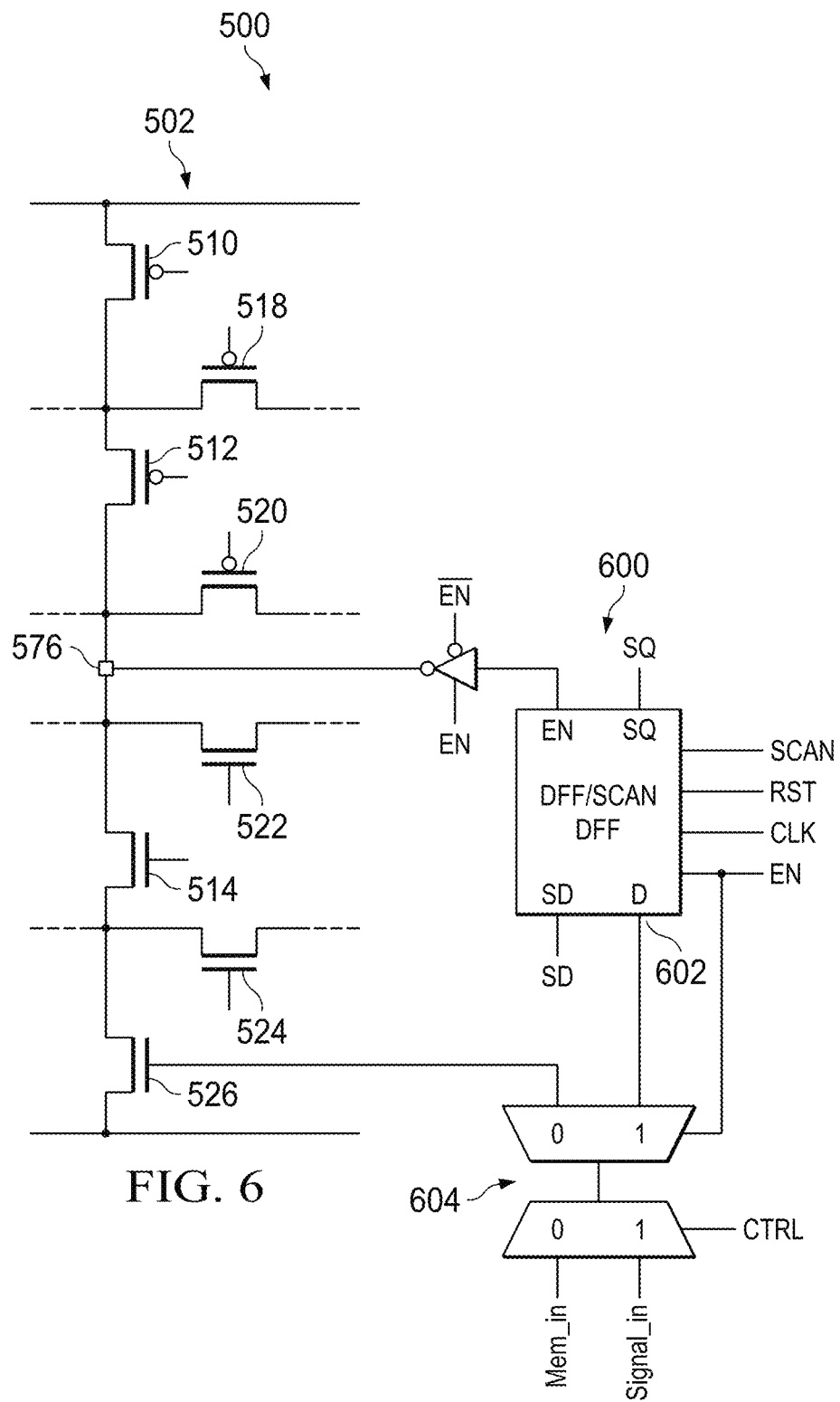
FIG. 6 is a schematic illustration of a built-in D flip-flop in a logic cell for a field-programmable transistor array in accordance with an illustrative embodiment.

Turning to FIG. 6, a schematic illustration of a built-in D flip-flop in a logic cell for a field-programmable transistor array is depicted in accordance with an illustrative embodiment. D flip-flop 600 may be an example of one implementation of D flip-flop 142 in logic cell 108 in FIG. 1. D flip-flop 600 is illustrated, for example, as part of logic cell 500 in FIG. 5.

For example, without limitation, D input 602 of D flip-flop 600 may be connected either to a transistor in first column of transistors 502 of logic cell 500, if ctrl=1 and enable=0, or to the D input of D flip-flop 600, if enable=1, via de-multiplexer 604. All D flip-flops provided by the logic cells in a field-programmable transistor array may be connected in a scan chain.

Figure 7:
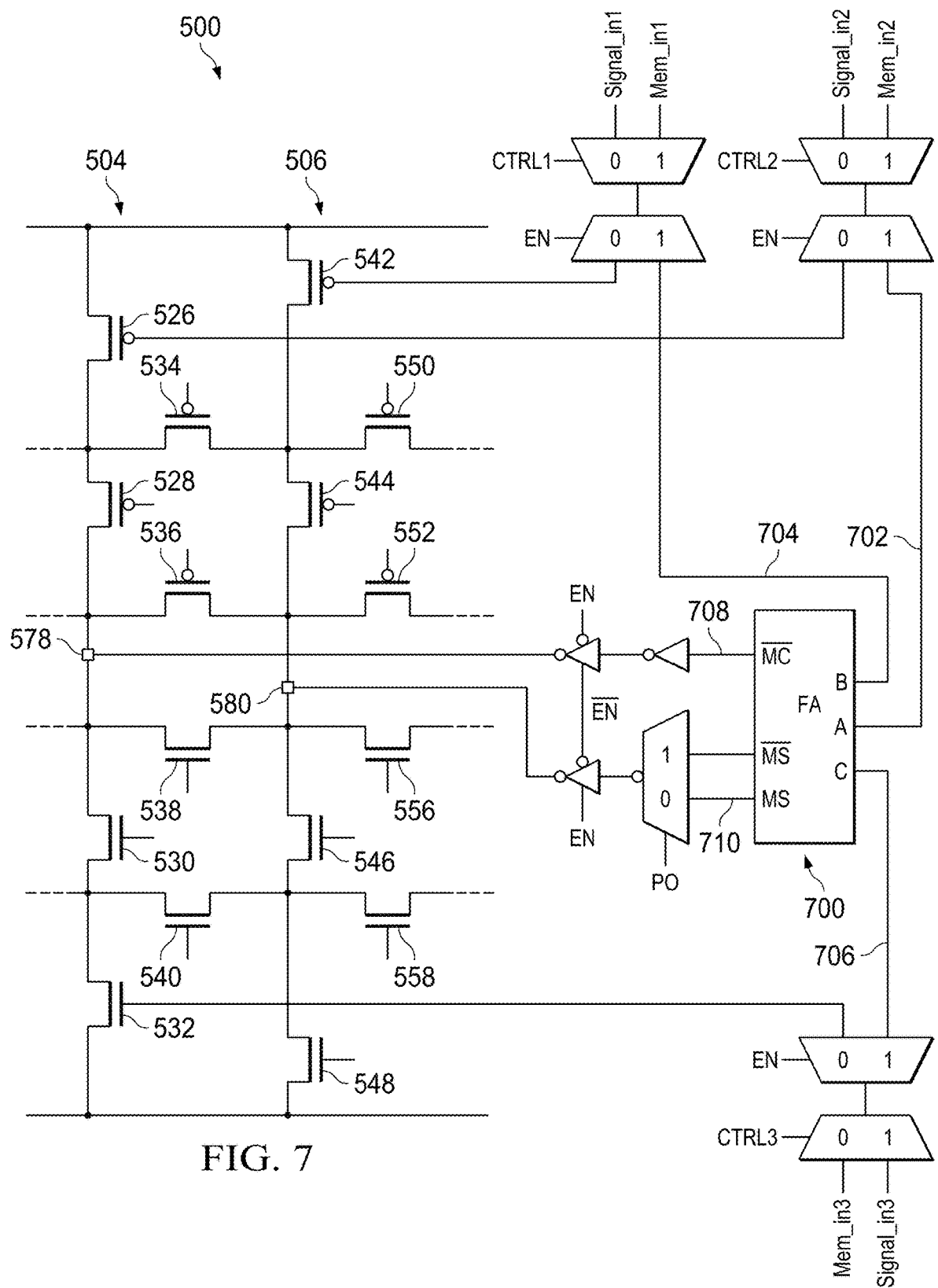
FIG. 7 is a schematic illustration of a built-in full adder in a logic cell for a field-programmable transistor array in accordance with an illustrative embodiment.

Turning to FIG. 7, a schematic illustration of a built-in full adder in a logic cell for a field-programmable transistor array is depicted in accordance with an illustrative embodiment. Full adder 700 may be an example of one implementation of full adder 144 in logic cell 108 in FIG. 1. Full adder 700 is illustrated, for example, as part of logic cell 500 in FIG. 5.

For example, without limitation, three inputs 702, 704, and 706 of full adder 700 may span across second column of transistors 504 and third column of transistors 506 of logic cell 500. Carry output 708 and sum output 710, either inverted or non-inverted, of full adder 700 may be provided at output 578 of second column of transistors 504 and output 580 of third column of transistors 506, respectively.

Figure 8:
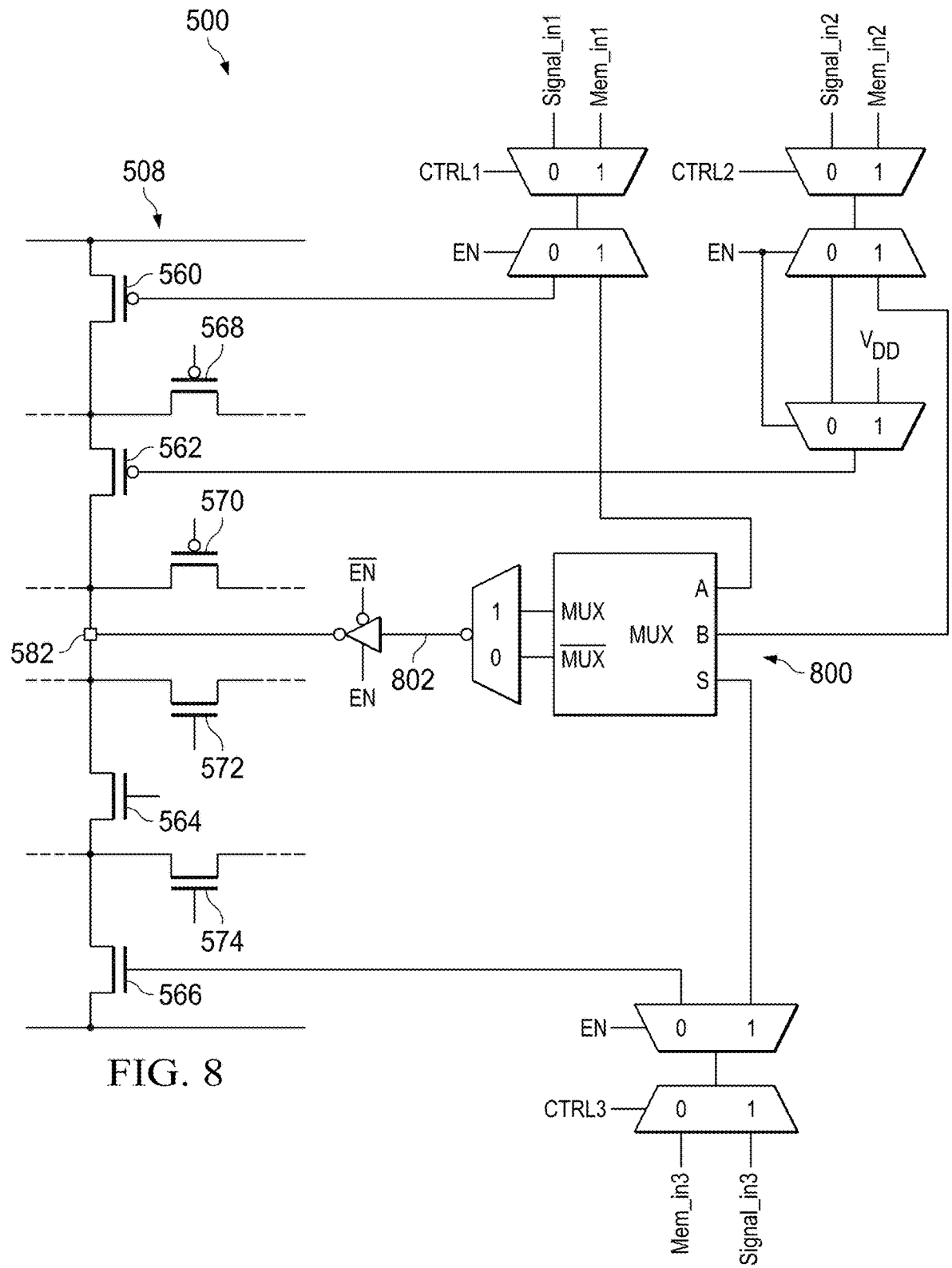
FIG. 8 is a schematic illustration of a built-in multiplexer in a logic cell for a field-programmable transistor array in accordance with an illustrative embodiment.

Turning to FIG. 8, a schematic illustration of a built-in multiplexer in a logic cell for a field-programmable transistor array is depicted in accordance with an illustrative embodiment. Multiplexer 800 may be an example of one implementation of multiplexer 146 in logic cell 108 in FIG. 1. Multiplexer 800 is illustrated, for example, as part of logic cell 500 in FIG. 5.

Multiplexer 800 may only occupy one column of transistors in logic cell 500. Output 802 of multiplexer 800 may be provided, in either inverting or non-inverting form, at output 582 of fourth column of transistors 508 of logic cell 500.

Figure 9:
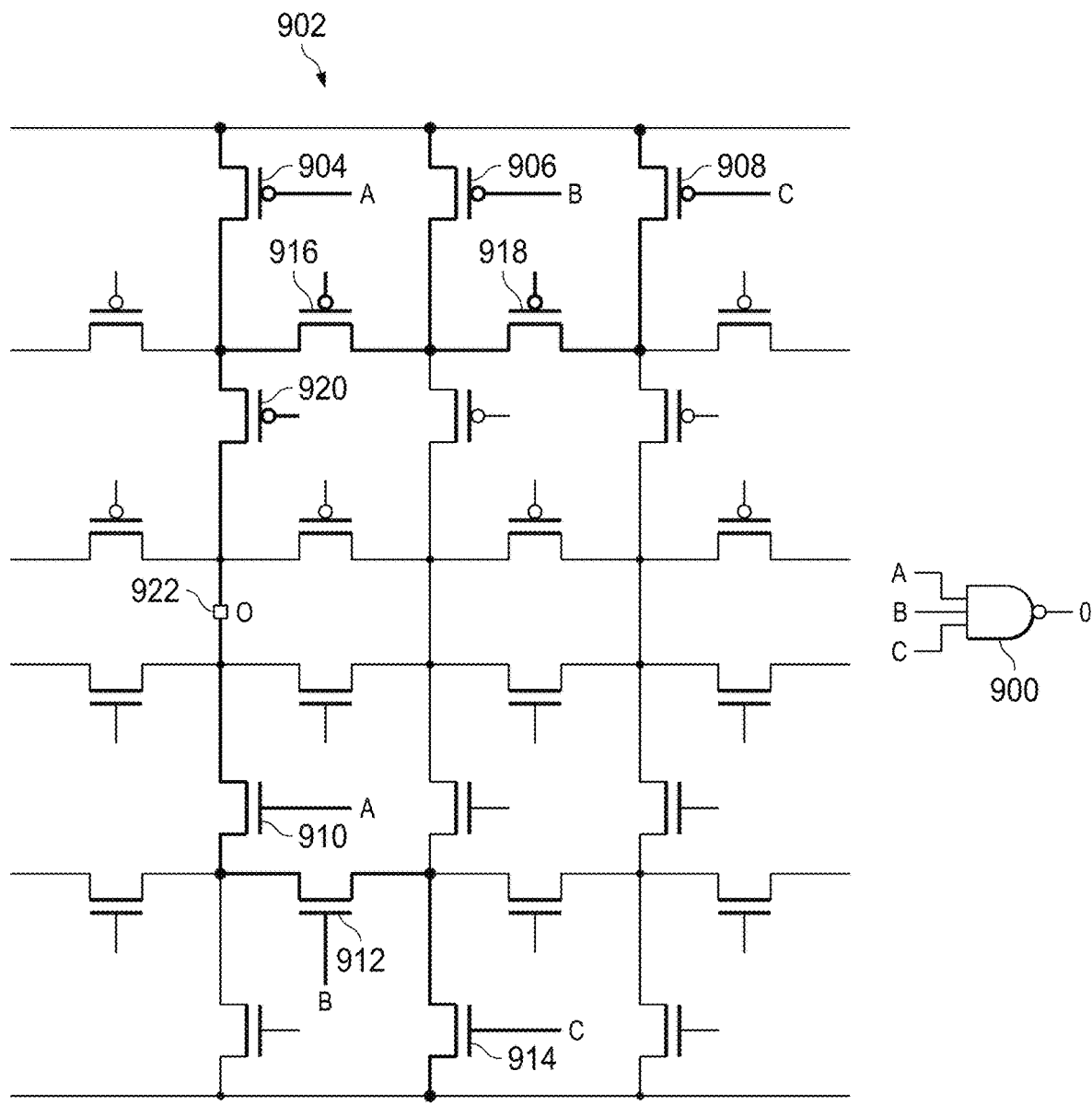
FIG. 9 is a schematic illustration of a logic cell configured to implement a three-input NAND gate (NAND3) in a field-programmable transistor array in accordance with an illustrative embodiment.

Turning to FIG. 9, a schematic illustration of a logic cell configured to implement three-input NAND gate (NAND3) 900 in a field-programmable transistor array is depicted in accordance with an illustrative embodiment. Configuration 902 may be an example of one implementation of configuration 118 of logic cell 108 in FIG. 1.

In this example, transistors 904, 906, 908, 910, 912, and 914 are programmed to receive and be controlled by the input logic signals for NAND3 gate 900. Transistors 916, 918, and 920 are programmed to be always on to complete the circuit with the output of NAND3 gate 900 at node 922. All of the other transistors in configuration 902 are programmed to be always off.

Turning to FIG. 10, a schematic illustration of a logic cell configured to implement AND-OR-INVERT (AOI22) gate 1000 in a field-programmable transistor array is depicted in accordance with an illustrative embodiment. Configuration 1002 may be an example of one implementation of configuration 118 of logic cell 108 in FIG. 1.

In this example, transistors 1004, 1006, 1008, 1010, 1012, 1014, 1016, and 1018 are programmed to receive and be controlled by the input logic signals for AOI22 gate 1000. Transistors 1020, 1022, and 1024 are programmed to be always on to complete the circuit to form the output of AOI22 gate 1000 at node 1026. All of the other transistors in configuration 1002 are programmed to be always off.

Figure 11:
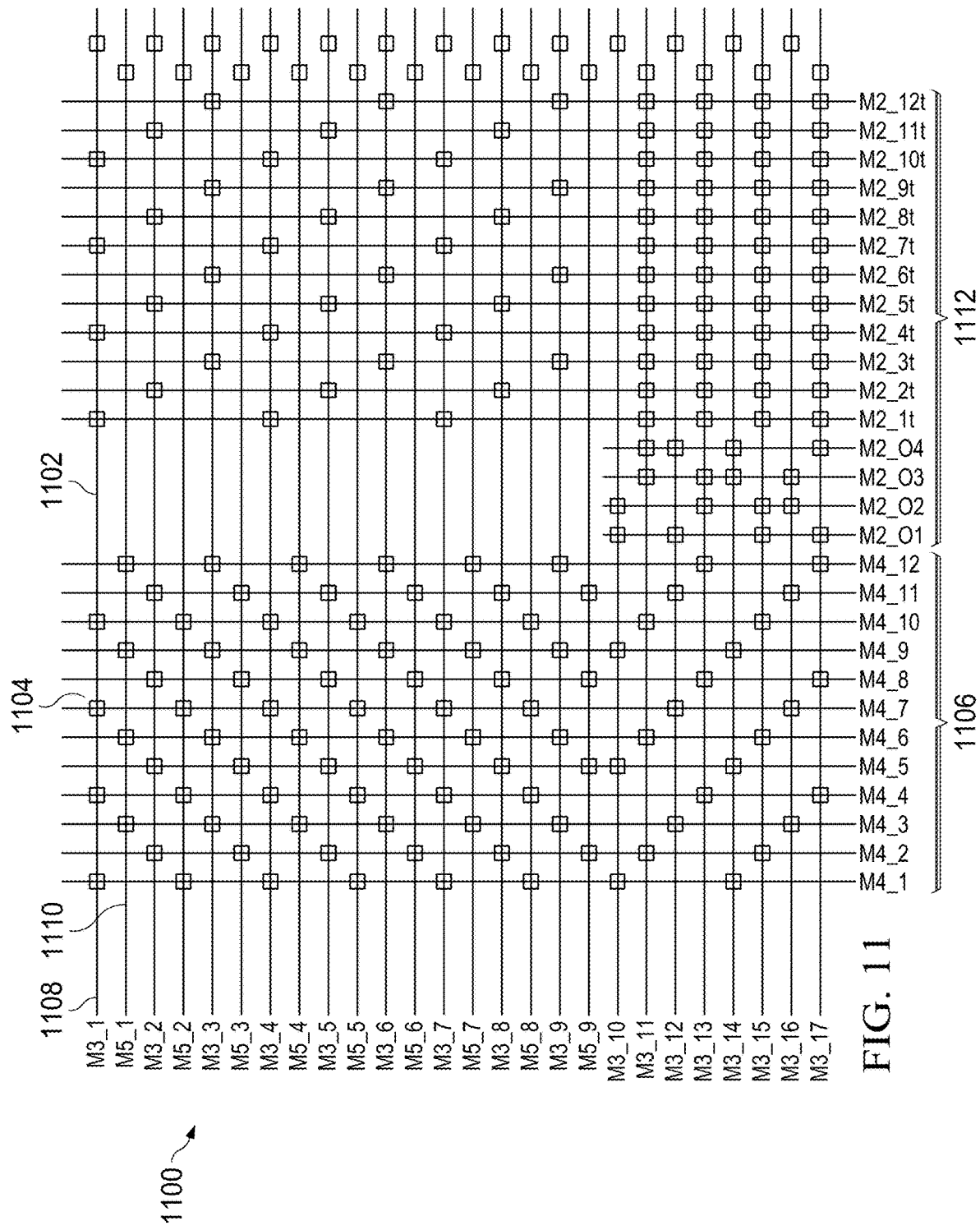
FIG. 11 is a schematic illustration of an upper routing switch block for a logic cell in a field-programmable transistor array in accordance with an illustrative embodiment.

Turning to FIG. 11, a schematic illustration of an upper routing switch block for a logic cell in a field-programmable transistor array is depicted in accordance with an illustrative embodiment. Upper routing switch block 1100 may be an example of one implementation of routing switch block 208 for logic cell 108 in FIG. 2. In particular, upper routing switch block 1100 may be an example of one implementation of an upper routing switch block for routing signals for logic cell 500 in FIG. 5.

Upper routing switch block 1100 comprises a plurality of intersecting metal lines 1102 with switches 1104 implemented at selected intersections between lines 1102. For example, without limitation, metal layer 2 (M2) and metal layer 4 (M4) may be the vertical routing resources for upper routing switch block 1100. Metal layer 3 (M3) and metal layer 5 (M5) may be the horizontal routing resources for upper routing switch block 1100. Each metal line 1102 in upper routing switch block 1100 is labeled with the letter M followed by the layer number, and then an underscore followed by the line or track number. Each switch 1104 may be implemented by an nMOS transistor controlled by a programming bit signal, with the source and drain of the transistor connecting two perpendicular metal lines 1102 (on different layers). An example implementation of switch 1104 is described in more detail below with reference to FIG. 12.

In this example, there are 12 vertical M4 lines 1106 that go over the logic cell unit along with switches 1104 connecting M4 lines 1106 to 17 horizontal M3 lines 1108 and to 9 M5 lines 1110. Each of 9 of M3 lines 1108 and each of the 9 M5 lines 1110 has 4 switches 1104 to M4 lines 1106. Each of the remaining 8 M3 lines 1108 has 3 switches 1104 to M4 lines 1106.

For upper routing switch block 1100, the 16 M2 lines 1112 terminate inside the logic cell, either at a pMOS gate input or at an output. For the corresponding lower routing switch block, the M2 lines may terminate inside the logic cell either at an nMOS gate input or at an output. For example, 4 of M2 lines 1112 connect to the outputs of the logic cell and 12 of M2 lines 1112 connect to pMOS inputs.

Each of the 12 M2 lines 1112 which connect to pMOS inputs has 7 connection choices to M3 lines 1108 via switches 1104. Each of the 4 M2 lines 1112 which connect to outputs has 8 connection choices to M3 lines 1108 via switches 1104, 4 in upper switch block 1100 and 4 in the corresponding lower switch block. M3 lines 11, 13, 15, and 17 facilitate local connections from an output of a logic cell to inputs of nearby logic cells.

The various metal lines 1102 may terminate at the boundary of a logic cell. Vertical M2 metal lines 1112 may terminate at the top and bottom of the logic cell. However, vertical M4 lines 1106 may be connected to M4 lines of other logic cells above and below, in either direction, using an optional bi-directional repeater. An example implementation of a bi-directional repeater that may be used for this purpose is described in more detail below with reference to FIG. 13.

The M3 horizontal metal lines 1108 and M5 horizontal metal lines 1110 may terminate at the left and right boundaries of the logic cell but connect to adjacent M3 and M5 lines in the neighboring logic cells via nMOS pass transistors. In order to limit the delay on these lines, after each 4 logic cells, the nMOS pass transistor be replaced with a bi-directional repeater. An example implementation of a bi-directional repeater that may be used for this purpose is described in more detail below with reference to FIG. 13.

Turning to FIG. 12, a schematic illustration of a switch for a routing switch block for a logic cell in a field-programmable transistor array is depicted in accordance with an illustrative embodiment. Switch 1200 may be an example of one implementation of switch 1104 in upper routing switch block 1100 in FIG. 11.

Switch 1200 may be implemented by nMOS transistor 1202 controlled by a programming bit signal on control line 1204. The source and drain of transistor 1202 are each connected to one of two perpendicular metal lines 1206 and 1208 (on different layers) in the routing switch block.

Transistor 1202 may not pass a full voltage level signal. Therefore, half-keeper 1210, 1212 may be added to each metal line 1206 and 1208, respectively.

Turning to FIG. 13, a schematic illustration of a bi-directional repeater for a field-programmable transistor array is depicted in accordance with an illustrative embodiment. Bi-directional repeater 1300 may be used to connect lines for routing signals between logic cells in plurality of logic cells 106 in field-programmable transistor array 100 in FIG. 1.

Figure 14:
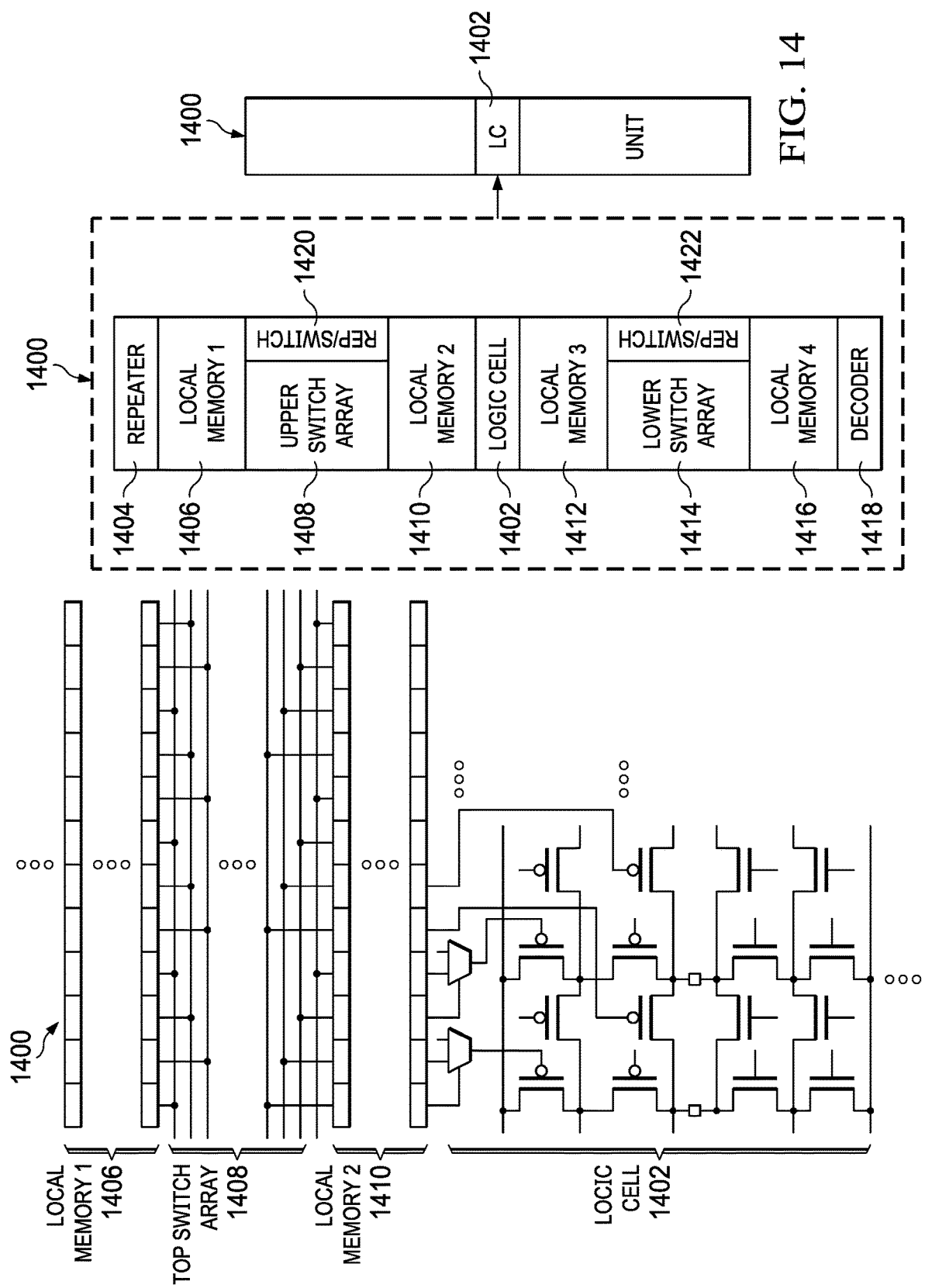
FIG. 14 is an illustration of a programming unit structure for a field-programmable transistor array in accordance with an illustrative embodiment.

Turning to FIG. 14, an illustration of a programming unit structure for a field-programmable transistor array is depicted in accordance with an illustrative embodiment. Programming unit 1400 may be an example of one implementation of a programming unit structure for programming configuration 118 of logic cell 108 in FIG. 1. The left portion of FIG. 14 shows detailed connections between different functional blocks in the upper half of programming unit 1400. The unit structure of programming unit 1400 is approximately symmetric. Therefore, the connections between functional blocks in the lower half of programming unit 1400 will be substantially similar to the connections shown in the left portion of FIG. 14.

Programming unit 1400 for logic cell 1402 may comprise logic cell 1402 and various functional blocks for programming logic cell 1402. For example, without limitation, programming unit 1400 may comprise logic cell 1402, repeater 1404, first local memory 1406, upper switch block 1408, second local memory 1410, third local memory 1412, lower switch block 1414, fourth local memory 1416, and decoder 1418. Repeaters and switches 1420 may be provided to connect signal lines in upper switch block 1408 for logic cell 1402 to signal lines in upper switch blocks for other logic cells in a field-programmable transistor array. Repeaters and switches 1422 may be provided to connect signal lines in lower switch block 1414 for logic cell 1402 to signal lines in lower switch blocks for other logic cells in the field-programmable transistor array. Example implementations of upper switch block 1408, lower switch block 1414, repeaters and switches 1420, and repeaters and switches 1422 are described in detail above with reference to FIGS. 11-13.

In accordance with an illustrative embodiment, local memory stores the programming bits used to configure unit 1400. Most of the programming bits are used to configure upper switch block 1408 and lower switch block 1414. To shorten the wiring, local memory may be separated into four parts. First local memory 1406 and second local memory 1410 may surround upper switch block 1408. Third local memory 1412 and fourth local memory 1416 may surround lower switch block 1414.

Figure 15:
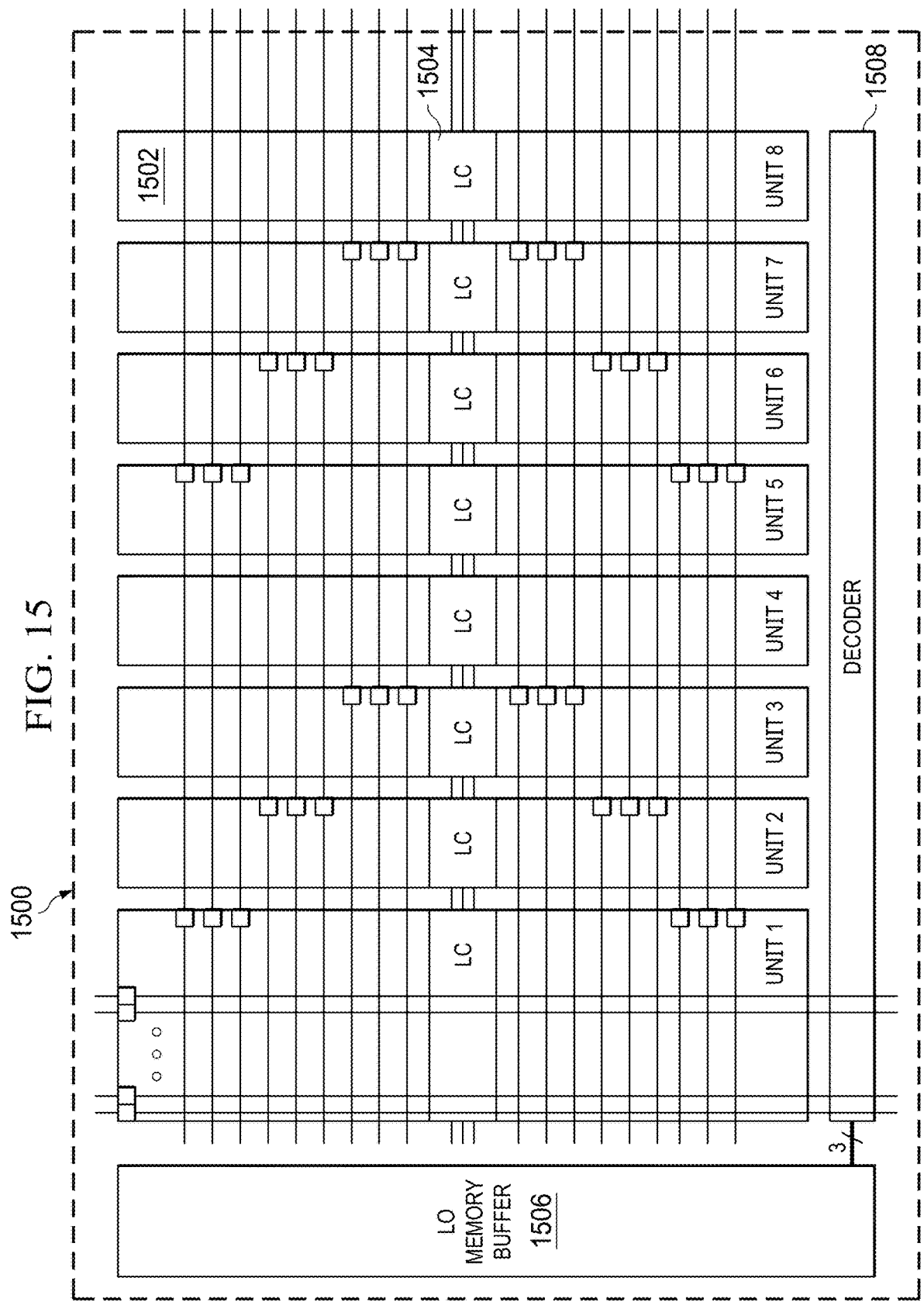
FIG. 15 is block-level schematic illustration of a group structure for programming units in a field-programmable transistor array in accordance with an illustrative embodiment.

Turning to FIG. 15, a block-level schematic illustration of a group structure for programming units in a field-programmable transistor array is depicted in accordance with an illustrative embodiment. Group 1500 may be an example of one implementation of a group of programming units for programming plurality of logic cells 106 in field-programmable transistor array 100 in FIG. 1.

Group 1500 comprises plurality of programming units 1502 for programming a corresponding plurality of logic cells 1504. In this example, group 1500 comprises eight programming units 1502 for programming eight corresponding logic cells 1504. Group 1500 of programming units in accordance with an illustrative embodiment may comprise more or fewer than eight programming units for programming more or fewer than eight logic cells.

For example, without limitation, using a known 130 nm 6-2-0 metal stack process (6 thin and 2 thick metal layers), the layout of a single unit 1502 may be 430 µm by 72 µm. Eight units 1502 may be combined to form group 1500 in a field-programmable transistor array. For example, without limitation, the size of group 1500 may be 430 µm by 620 µm or any other appropriate size.

Group 1500 may further comprise level 0 memory buffer 1506 and decoder 1508. Level 0 memory buffer 1506 may be used to supply programming bits to the local memory for each of programming units 1502 comprising group 1500. For example, without limitation, each programming unit may comprise 16 columns, each of which contains a payload of 33 programming bits. The total number of columns for group 1500 therefore may be 16×8=128 columns. In this case, 7 address bits may be appended to the 33 programming bits to direct the payload to the proper column. For example, without limitation, three of the address bits may select a programming unit 1502 and the remaining four of the address bits may select a column within that programming unit. Thus, when writing a 33-bit payload to local memory, level 0 memory buffer may pass a word of 40 bits to group 1500.

Figure 16:
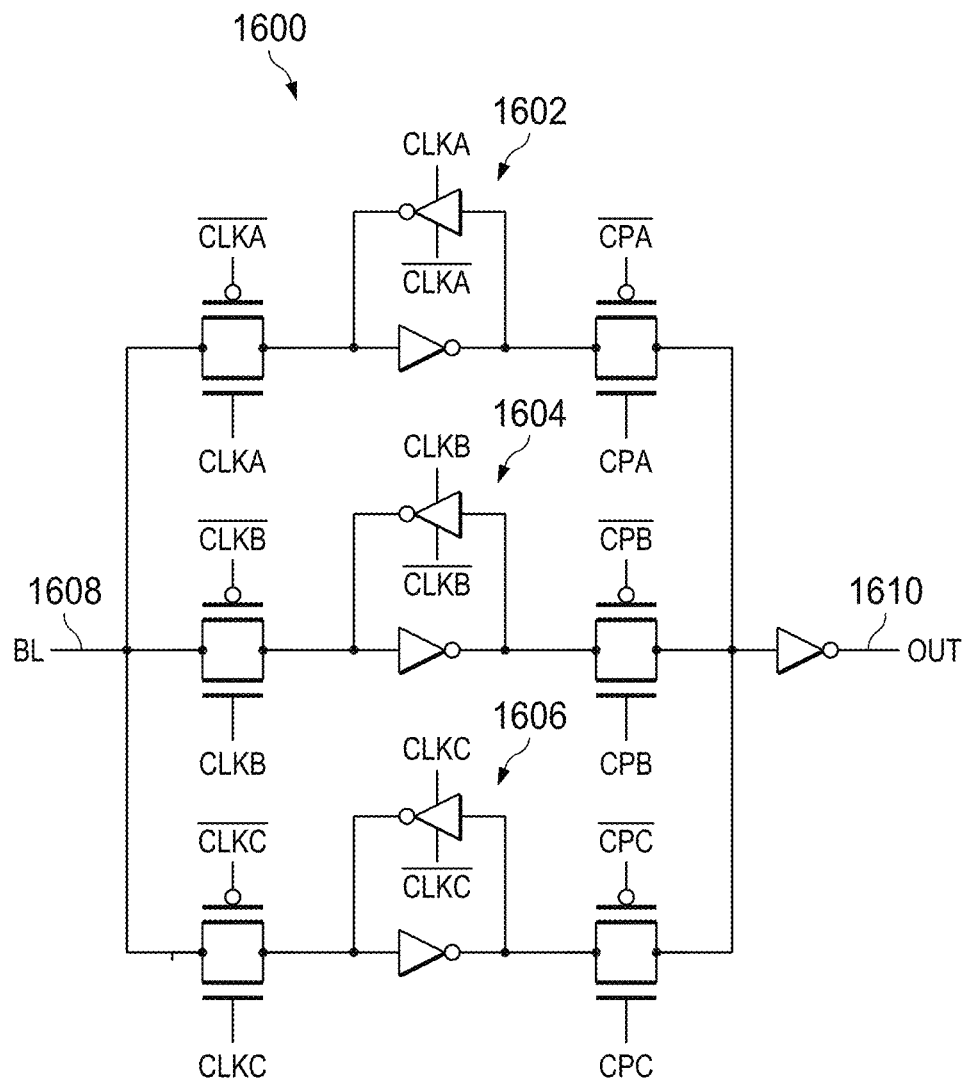
FIG. 16 is a schematic illustration of a local memory structure for a field-programmable transistor array in accordance with an illustrative embodiment.

Turning to FIG. 16, a schematic illustration of a local memory structure for a field-programmable transistor array is depicted in accordance with an illustrative embodiment. Local memory structure 1600 may be an example of one implementation of a local memory cell structure for one programming bit in local memory 210 for logic cell 108 in FIG. 2.

In this example, local memory structure 1600 comprises latches 1602, 1604, and 1606 driven by transmission gate switches. Three latches 1602, 1604, and 1606 are connected in parallel to allow three separate programming bit streams to be stored in local memory structure 1600 at the same time. A local memory structure in accordance with an illustrative embodiment may comprise more or fewer than three latches to allow more or fewer than three programming bit streams to be stored at the same time. In any case, local memory structure 1600 enables changing the configuration of a field-programmable digital array from one configuration to another configuration in a single-cycle or less.

When writing a programming bit to local memory 1600 on bit line 1608, one of the global control signals clka, clkb, or clkc is used to select the appropriate latch 1602, 1604, or 1606 to receive the bit. Subsequently, one of the global copy signals cpa, cpb, or cpc is used to select the programming bit stored in one of latch 1602, 1604, or 1606 to be presented on output line 1610 to configure the field-programmable transistor array. For each memory cell, only one of cpa, cpb, or cpc is high at any given time to select the one latch 1602, 1604, or 1606, that is supplying the programming bit to the field-programmable transistor array.

The design of local memory structure 1600 enables dynamic reconfiguration of a field-programmable transistor array within one clock cycle, by turning off one copy signal cpa, cpb, or cpc that is currently on and turning on a different one of copy signals cpa, cpb, or cpc that is currently off. Furthermore, a field-programmable transistor array may be running one configuration while the programming bits for a new configuration of the system are loaded. For example, while running a field-programmable transistor array system that has been configured by selecting the programming bit stored in latch 1602 using copy signal cpa, control signal clkb may be turned on to load a programming bit for an alternative configuration that is provided on input line 1608 into latch 1604 of local memory structure 1600. Since copy signal cpb is off, the value of latch 1604 is not provided at output 1610 of local memory structure 1600 and, therefore, the current state of the field-programmable transistor array is not affected by the loading of the programming bit for the alternative configuration into latch 1604. After a programming bit for the alternate configuration is loaded in latch 1604 using control signal clkb, a programming bit for another alternative configuration may be provided on input line 1608 and loaded into latch 1606 by turning off control signal clkb and turning on control signal clkc. While control signal clkc is active to load the programming bit for the other alternative system configuration into latch 1606, within one clock cycle, execution of the configuration defined by the programming bit stored in latch 1604 may start or resume by turning on copy signal cpb to provide the programming bit stored in latch 1604 on output 1610 of local memory structure 1600.

Illustrative embodiments thus provide for storing the programming for a plurality of different configurations for a field-programmable transistor array in local memory, switching between different stored configurations of the field-programmable transistor array within a clock cycle, and switching between two stored configurations of the field-programmable transistor array while loading the programming for another configuration for the field-programmable transistor array in local memory. In order to properly enable switching between running configurations, not unlike swapping jobs in a central processing unit of a computer, separate system or finite state machine flip-flops may be provided for each copy signal. Along those lines, with reference to FIG. 6, which is simplified, there may be more than one flip-flop whose output may optionally appear at the first column of a logic cell. For example, without limitation, three different flip-flops may be enabled by copy signals, cpa, cpb, and cpc, respectively.

Figure 17:
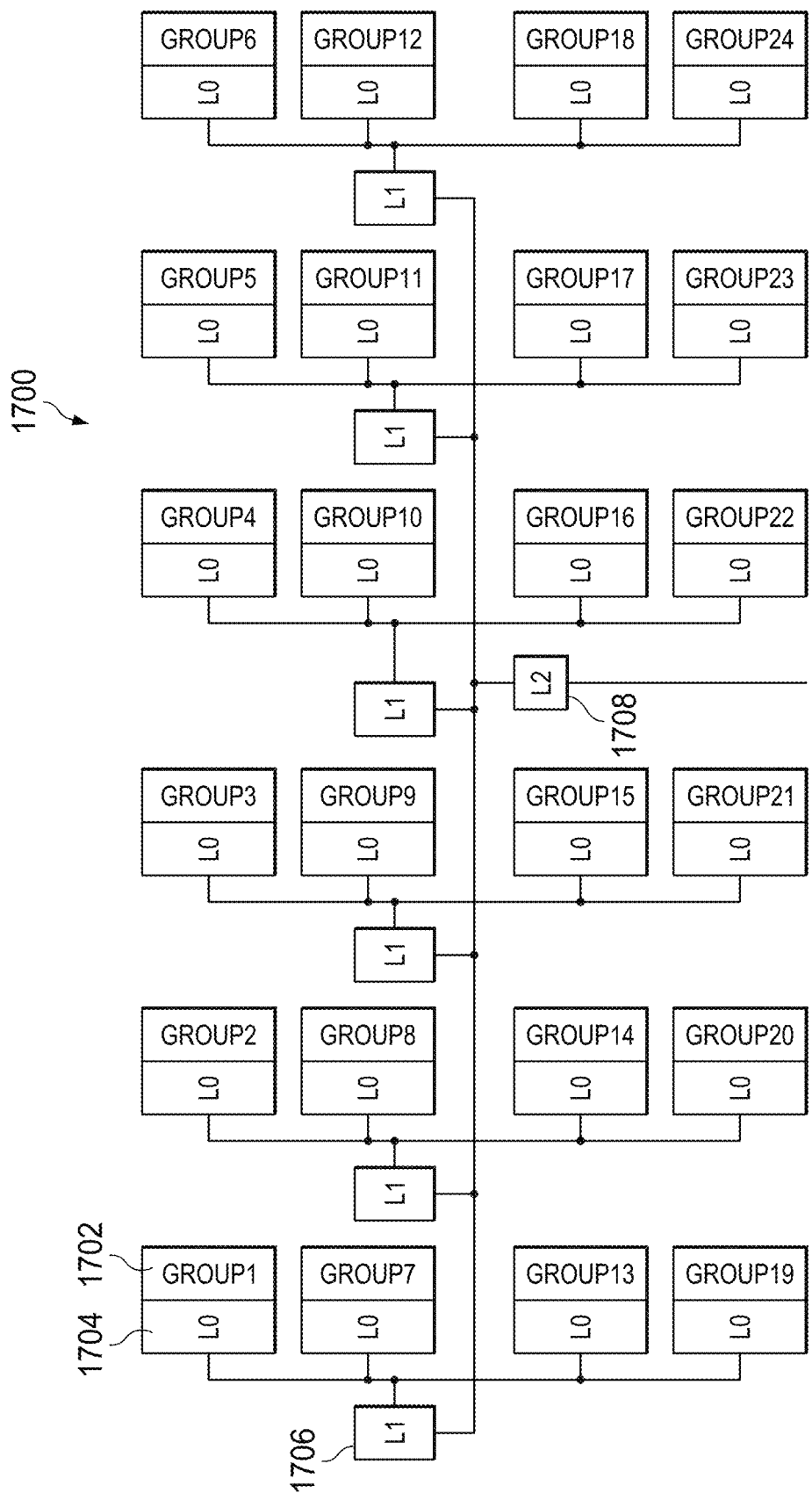
FIG. 17 is a block diagram of an asynchronous memory buffer pipeline for a field-programmable transistor array in accordance with an illustrative embodiment.

Turning to FIG. 17, a block diagram of an asynchronous memory buffer pipeline for a field-programmable transistor array is depicted in accordance with an illustrative embodiment. Asynchronous memory buffer pipeline 1700 may be configured to rapidly program field-programmable transistor array 100 in FIG. 1.

For example, without limitation, asynchronous memory buffer pipeline 1700 may comprise six groups 1702 of programming units horizontally and four groups 1702 of programming units vertically. An asynchronous memory buffer pipeline in accordance with an illustrative embodiment may comprise any other appropriate number of groups 1702 of programming units or any other appropriate arrangement of groups 1702 of programming units.

Each group 1702 of programming units may comprise level 0 memory buffer 1704. When writing programming bits to local memory in programming units of group 1702, level 0 memory buffer 1704 of each group 1702 may be supplied by a level 1 memory buffer 1706. Each level 1 memory buffer 1706 may supply a plurality of groups 1702. For example, without limitation each level 1 memory buffer 1706 may supply four groups 1702 or any other appropriate number of groups 1702.

In this example, level 1 memory buffer supplies a word to one of four level 0 memory buffers 1704, arranged vertically. The word size for level 1 memory buffer 1706 may be 42 bits, including 40 bits needed by the selected level 0 memory buffer 1704 to load local memory plus 2 address bits to select the particular level 0 memory buffer.

Level 1 memory buffers 1704 may be fed by level 2 memory buffer 1708. In this example, the word size for level 2 memory buffer consists of 45 bits: including 42 bits needed by a particular level 1 memory buffer 1706 plus 3 bits to select the particular level 1 memory buffer 1706. The 45-bit words may be supplied to the level 2 memory buffer by an off-chip memory. In order to facilitate fast pipelined read-out of the programming bits, the various memory buffers 1704, 1706, and 1708 may be bi-directional.

Asynchronous memory buffer pipeline 1700 may be used to achieve a high programming rate. For example, after level 2 memory buffer 1708 receives a 33-bit payload from off-chip, it may forward it, along with the address for a particular level 0 memory buffer to which the payload is directed, to the appropriate level 1 memory buffer 1706 as soon as the level 1 memory buffer 1706 is ready to receive it. When the level 1 memory buffer 1706 receives the address and payload, the level 2 memory buffer 1708 is free to accept a new address and payload from off-chip. The rate at which programming bits may be sent from off-chip using asynchronous memory buffer pipeline 1700 may be very high. Detailed circuit simulations show that the programming bit data rate may be nominally 9.0 Gbps.

Figure 18:
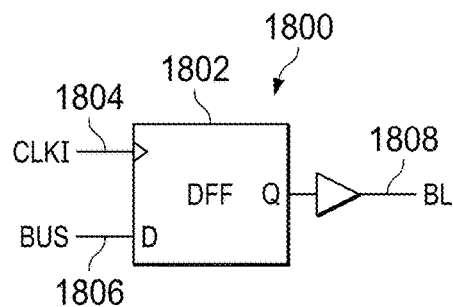
FIG. 18 is a schematic illustration of a programming bit register for a field-programmable transistor array in accordance with an illustrative embodiment.

Turning to FIG. 18, a schematic illustration of a programming bit register for a field-programmable transistor array is depicted in accordance with an illustrative embodiment. Programming bit register 1800 may comprise D flip-flop 1802. A control signal clk on line 1804 triggers D flip-flop 1802 to pass the data on bus line input 1806 to output 1808. Programming bit registers in level 2 memory buffer, level 1 memory buffers, and level 0 memory buffers in an asynchronous memory buffer pipeline may be controlled by distinct control signals clk. Control signals clk for operation of programming bit register 1800 may be derived from an asynchronous pipeline control unit.

Figure 19:
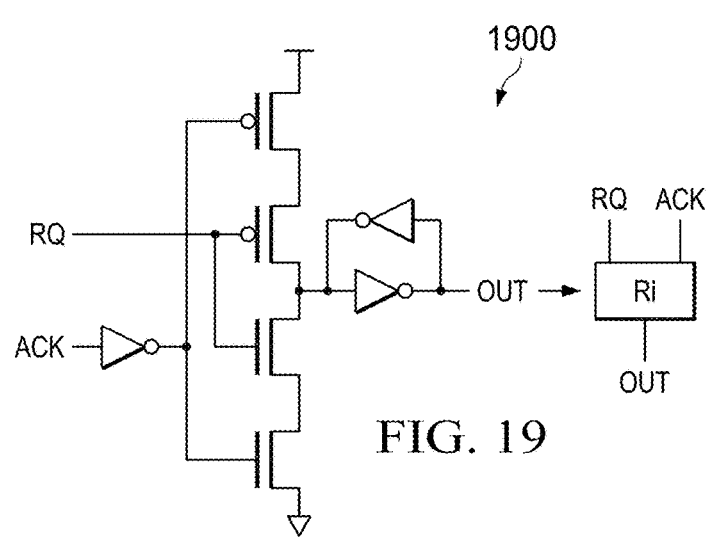
FIG. 19 is a schematic illustration of a Muller C-element for a field-programmable transistor array in accordance with an illustrative embodiment.

Turning to FIG. 19, a schematic illustration of a Muller C-element for a field-programmable transistor array is depicted in accordance with an illustrative embodiment A bounded-delay asynchronous pipeline control scheme may be used. Each stage of the asynchronous pipeline consists of a Muller C-element 1900. When a stage Ri receives a request (req) from the previous stage Ri−1, if the acknowledge (ack) from the next stage Ri+1 is available (active low), then a request is generated to Ri+1 along with an acknowledge to Ri−1.

Figure 20:
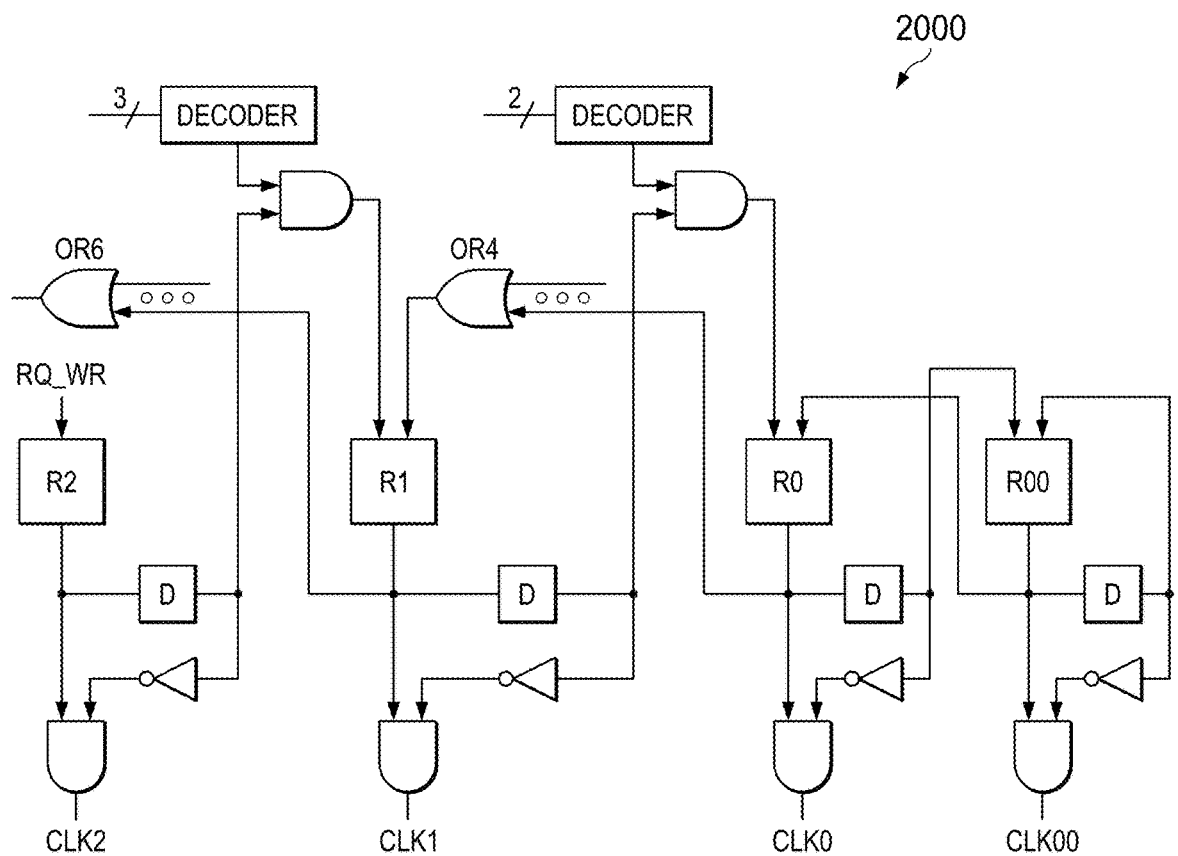
FIG. 20 is a schematic illustration of an asynchronous write-in control scheme for a field-programmable transistor array in accordance with an illustrative embodiment.

Turning to FIG. 20, a schematic illustration of an asynchronous write-in control scheme for a field-programmable transistor array is depicted in accordance with an illustrative embodiment. The asynchronous control scheme 2000 is used for writing programming bits to the local memories. The signal clki (where i is the stage index of the memory buffer) is generated by the logical AND of Ri and the inversion of the (bounded) delayed Ri. This is basically a pulse generator that ensures that the various local clocks (clki) are non-overlapping in their high portions. The signal clki is used to trigger the DFFs in the Li memory buffer. R2 receives the request to write programming bits (RQ_WR) from off-chip. Since the L2 memory buffer feeds any of six L1 memory buffers in the prototype, acknowledge signals from all six of them are OR-ed to form the acknowledge for R2. Also, since each L1 memory buffer feeds any of four L0 memory buffers, acknowledge signals from all four of them are OR-ed to form the acknowledge for R1. The local memory driven by the L1 memory buffer is controlled by local clock clk00. Note that the last stage uses the delayed request as its acknowledge.

The delay elements (D's), shown in asynchronous control scheme 2000, may be set based on careful worst-case simulation of the extracted layout of the prototype. Since this pipeline is used for programming bits and is not a signal datapath, maximum throughput is not required. Therefore, we conservatively double the worst-case simulated delay (including worst-case corner) to set the delay element value with sufficient margin to handle process, voltage, and temperature (PVT) variations.

Our base library consists of all the possible inverting gates that are feasible with our FPTA and its series limit of three transistors. The 24 base library components are: INV, NAND2, NOR2, AOI12, AOI22, OAI12, OAI22, NAND3, NOR3, AOI31, OAI31, AOI41, OAI41, AOI32, OAI32, AOAI311, OAOI311, AOAI211, OAOI211, AOOAI212, OAAOI212, AOAAI2111, OAOOI2111 and MAJI (which is the inverted mirror carry). In addition, the following custom cells are built into the logic cells: FA, FAI, DFF, MUX and MUXI.

To further increase logic density, numerous compounds of the 24 base library cells are also provided. Compound cells are created by appending an inverter (or a NAND2 or NOR2) to one input and/or the output of each of the 24 base cells, resulting in a total of 234 compound cells. Compound cells are placed as a unit but are decomposed into their constituent base cells prior to routing.

We also developed the necessary CAD tool-flow for programming the FPTA. Our tool-flow consists of industry-standard commercial tools along with open-source software which has been modified to work with our architecture. Synopsys Design Compiler is used to synthesize a gate-level netlist from the Register-Transfer Level (RTL) description of the design. The cell library, consisting of 24 base cells, 11 built-in cells and 234 compounds was characterized using Synopsys SiliconSmart. Placement is done through Timber-Wolf, which is very effective in row-based placement. For routing, we modified the source code of the open-source tool VPR (Versatile Place and Route) to make it compatible with our architecture. Finally, bit-stream generation is done through a Python script which we developed for this purpose.

We designed and laid out a prototype for fabrication using the IBM 130 nm 1.2V process. It includes a 6×4 array of groups, each containing 8 logic cells, for a total of 192 logic cells. The overall size is 4113.41 um×2769.50 um.

In order determine the area utilization efficiency of our FPTA, we compared it with a commercial FPGA, Altera Stratix EP1S10, which uses the same 130 nm technology and has a core size of 23 mm×23 mm. To make a fair comparison, we scaled up our FPTA to the same size, resulting in an array of 51×35 groups of 8 logic cells, for a total of 14,280 logic cells. We then implemented various benchmarks and opencores on both our FPTA and the Altera chip. A comparison of the resource utilization is presented in Table 1.

TABLE 1

Area utilization compared to a commercial FPGA.

| Benchmark | Cell Count (Synopsys DC) | FPTA Utilization | Altera Stratix Utilization |
|---|---|---|---|
| B04 | 317 | 1.02% | 2% |
| B05 | 353 | 1.29% | 2% |
| B12 | 539 | 2.02% | 4% |
| SPI | 1240 | 4.27% | 8% |
| B14 | 2123 | 8.69% | 10% |
| Tv80 | 3077 | 11.13% | 19% |
| B15 | 3461 | 12.18% | 22% |
| B20 | 4407 | 17.78% | 20% |
| B21 | 4635 | 19.07% | 20% |
| B22 | 6702 | 26.85% | 29% |
| B17 | 10942 | 37.75% | 68% |
| AES_cipher | 9422 | 38.91% | 47% |
| AES_inv_cipher | 13578 | 52.07% | 72% |
| WB_conmax | 16436 | 70.00% | 148% |
| B18* | 25303 | 87.85% | 140% |

*One instance of B15 is removed from B18 to reduce the size of the benchmark to ensure that it fits within the available resources.

Despite the additional area overhead due to having three memory cells per programming bit, the density (or utilization) of the FPTA is quite competitive with the Altera chip. We attribute this observation to the fact that for logic outside the custom cells (e.g., full adders, carry units, flip-flops, multiplexers) that both designs possess, the transistor utilization of the logic cells in the FPTA is higher than the transistor utilization of the LUTs in the Altera design. Essentially, even a relatively simple logic function might take up an entire LUT, whereas in the FPTA, only the precise number of columns needed to implement the gate are used. Thus, simple gates such as NAND2, NAND3, NOR2, NOR3, and up to three or even four input AOI and OAI gates are comparatively very area-efficient in the FPTA.

Figure 21:
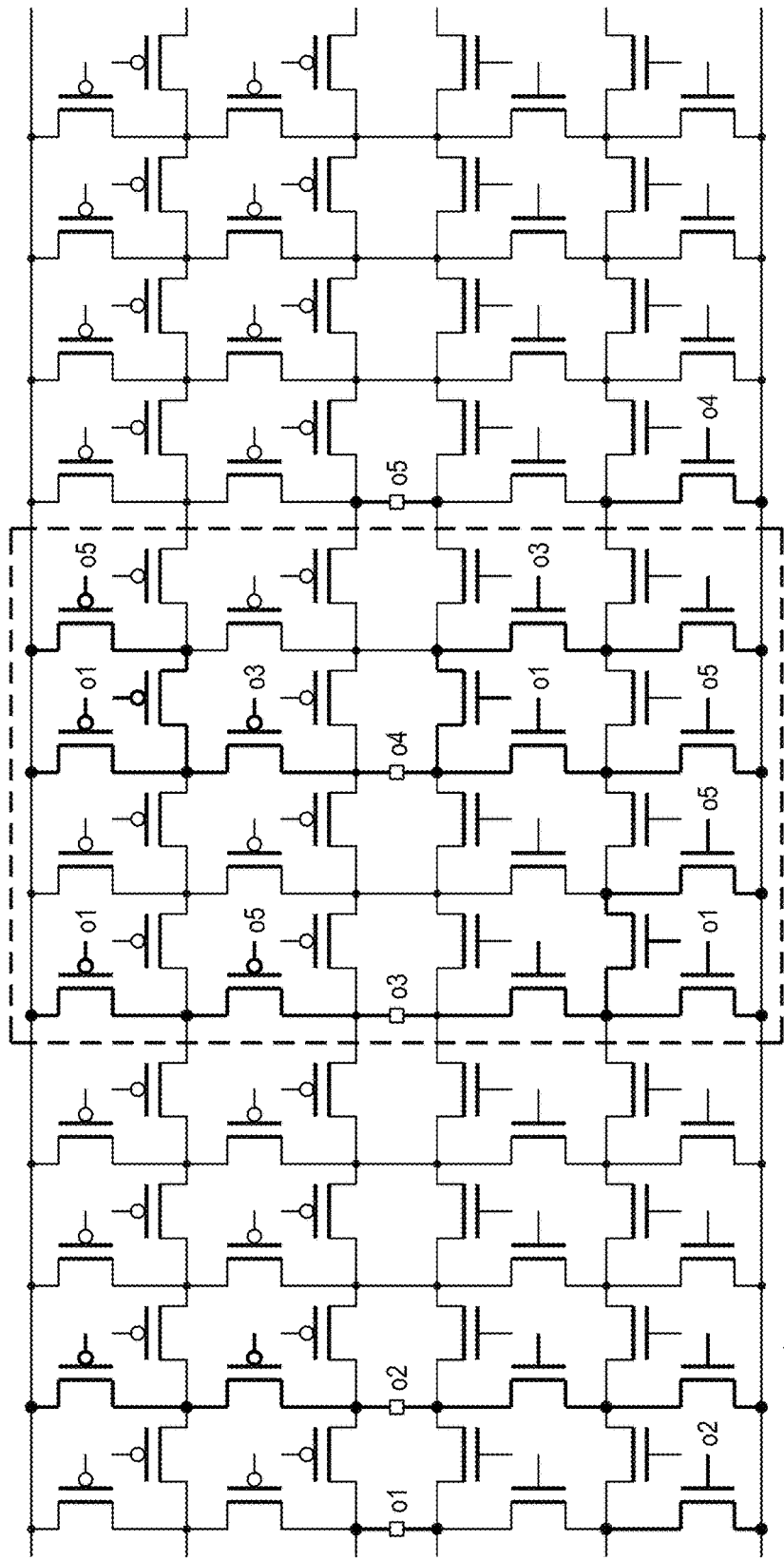
FIG. 21 is a schematic illustration of a field-programmable transistor array configured to implement a 2-bit up counter in accordance with an illustrative embodiment.
Figure 21:
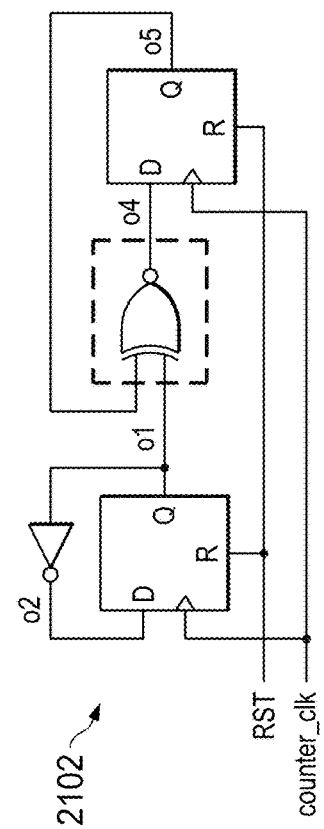

Turning to FIG. 21, a schematic illustration of a field-programmable transistor array 2100 configured to implement a 2-bit up counter 2102 is depicted in accordance with an illustrative embodiment.

Figure 22:
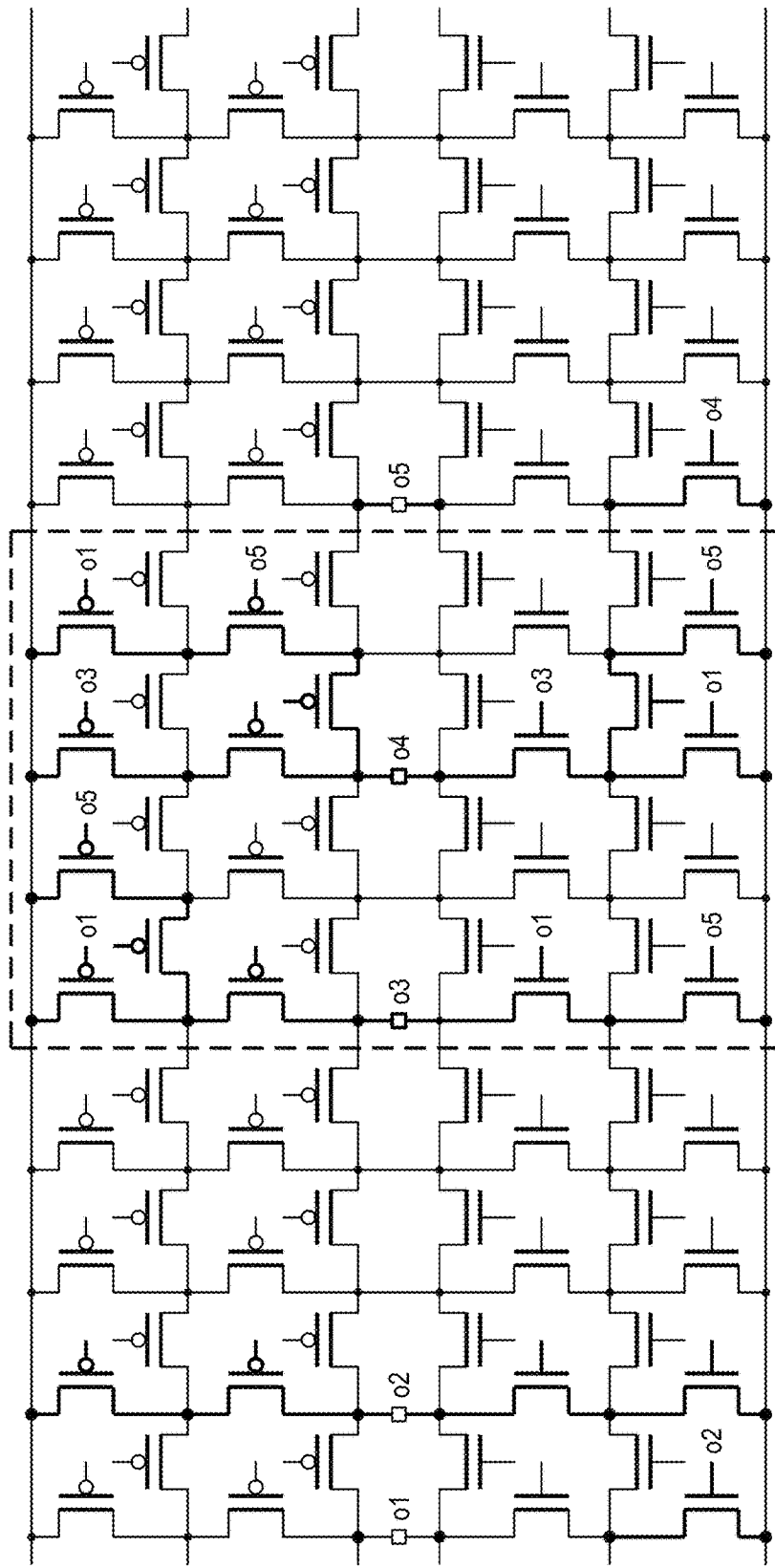
FIG. 22 is a schematic illustration of a field-programmable transistor array configured to implement a 2-bit down counter in accordance with an illustrative embodiment.
Figure 22:
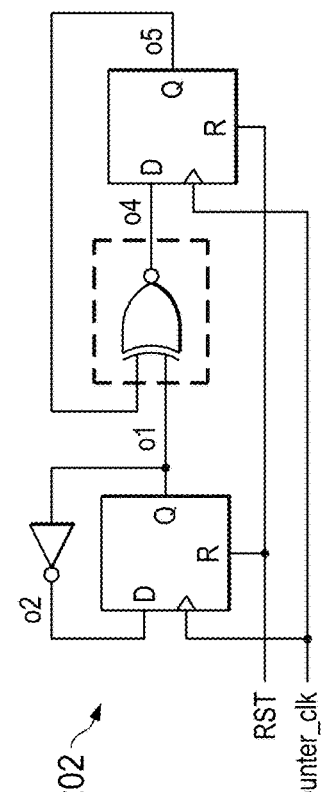

Turning to FIG. 22, a schematic illustration of a field-programmable transistor array 2200 configured to implement a 2-bit down counter 2202 is depicted in accordance with an illustrative embodiment.

Figure 23:
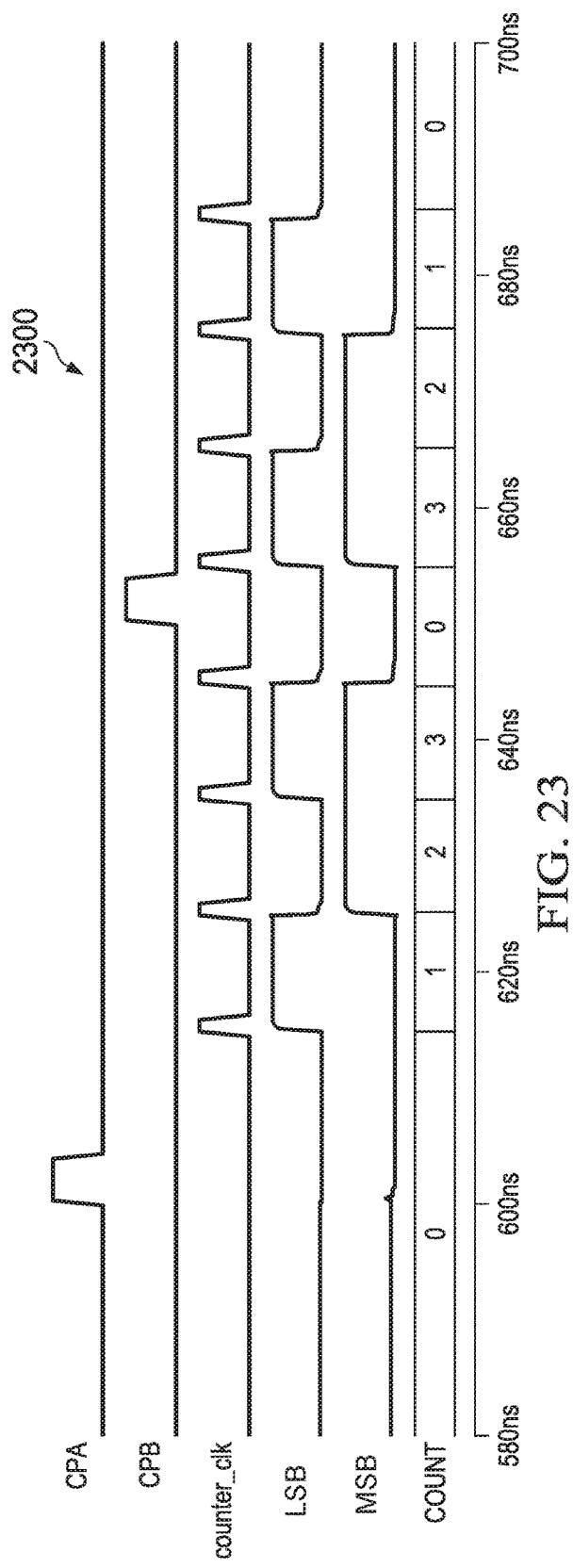
FIG. 23 is an illustration of timing of signals for a single-cycle reconfiguration of a field-programmable transistor array in accordance with an illustrative embodiment.

Turning to FIG. 23, an illustration of timing of signals 2300 for a single-cycle reconfiguration of a field-programmable transistor array is depicted in accordance with an illustrative embodiment.

Figure 24:
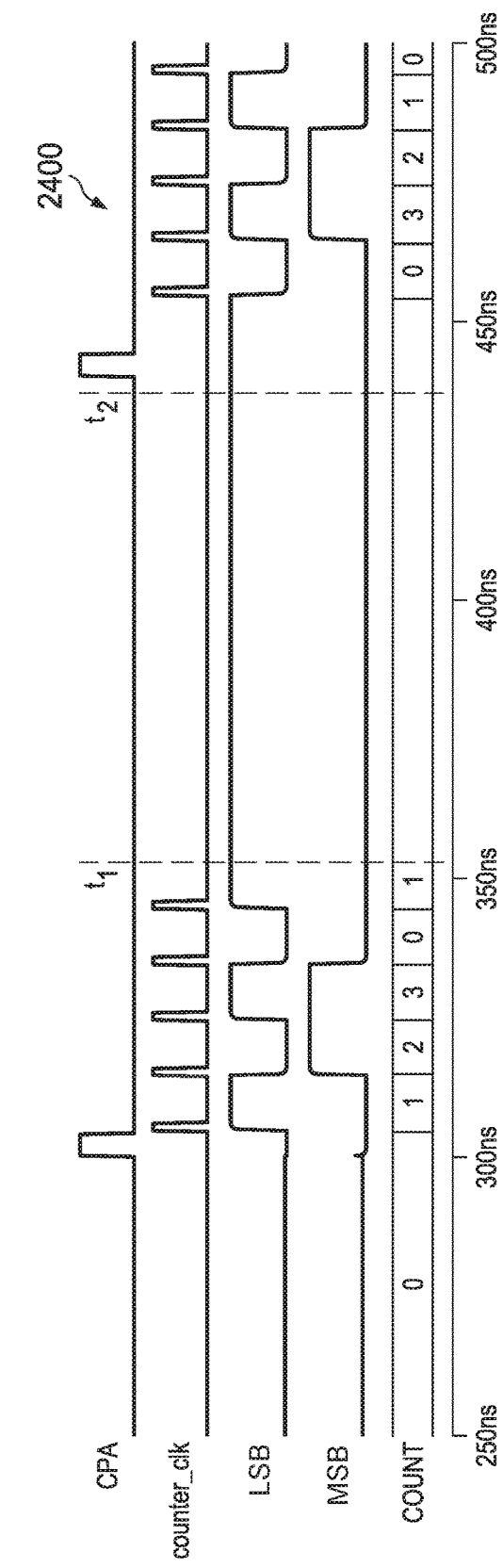
FIG. 24 is an illustration of timing of signals for a partial dynamic reconfiguration of a field-programmable transistor array in accordance with an illustrative embodiment.

Turning to FIG. 24, an illustration of timing of signals 2400 for a partial dynamic reconfiguration of a field-programmable transistor array is depicted in accordance with an illustrative embodiment.

The single-cycle reconfiguration capability of the FPTA is demonstrated using two 2-bit counters, shown in FIGS. 21 and 22, one counting upwards 2100 and the other counting downwards 2200, along with the waveforms 2300 and 2400 shown in FIGS. 23 and 24, respectively. Two separate bit-streams are generated for the 'up counter' 2100 and 'down counter' 2200 and are loaded into the A and B latches of the local memory of the FPTA, respectively. As shown in FIG. 23, the up counter is activated when the cpa pulse is provided and the counter starts counting 'up' from 0 to 3 based on the counter_clk pulses. As soon as cpb arrives, the bit-stream corresponding to the down counter is activated, within a single cycle, and the counter counts 'down' from 3 to 0. The waveforms confirm that the FPTA resources can be time-shared between two different bit-streams with a single-cycle toggle.

The partial/selective dynamic reconfiguration capability is demonstrated using an example of a 2-bit counter, which is initially configured as an up counter 2100, as shown in FIG. 21. By selectively changing only the bits corresponding to the logic cell in the middle, it's functionality is changed into a down counter 2200, as shown in FIG. 22. This selective reconfiguration mode also allows the retention and transfer of computational state between the initial and the modified bit-stream, as illustrated in the waveforms 2400 of FIG. 24.

Initially, the bit-stream of an up counter is loaded and the counter starts counting up from 0, soon after receiving the cpa pulse. The counter is run through one full counting cycle and is stopped at the count '1' of its second counting cycle (time t1). Between t1 and t2, the portion shown between the dashed lines in FIG. 24, the FTPA is reconfigured. This converts the up counter into a down counter. At time t2, the down counter starts counting down from the same state (count '1') where the up counter had stopped. Selective reconfiguration eliminates the need to reload the entire bit-stream for a small design change; hence, the time required for reconfiguring the FPTA is proportional to the number of bits changed in the bit-stream.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

What is claimed is:

1. A field-programmable transistor array, comprising:
a plurality of logic cells, wherein each of the plurality of logic cells comprises a plurality of columns of transistors, wherein each of the plurality of columns of transistors comprises a plurality of first transistors and a plurality of second transistors;

wherein each of the plurality of first transistors are individually programmable to be either always on, always off, or to be controlled by a logic signal;

wherein a number of the plurality of second transistors are configured to be programmed to be always on or always off or to be controlled by a logic signal;

wherein the first transistors in a first column of transistors comprise a first two pMOS transistors connected in series with each other and a first two nMOS transistors connected in series with each other, and wherein the first two pMOS transistors are connected in series with the first two nMOS transistors; and wherein the second transistors comprise second pMOS transistors connecting the first two pMOS transistors to pMOS transistors in the first transistors in a second column of transistors and second nMOS transistors connecting the first two nMOS transistors to nMOS transistors in the first transistors in the second column of transistors.

2. The field-programmable transistor array of claim 1, wherein the first transistors and the second transistors in the plurality of columns of transistors in a logic cell in the plurality of logic cells is programmed to configure the logic cell to implement the function of a logic gate.

3. The field-programmable transistor array of claim 1, wherein a logic cell in the plurality of logic cells further comprises additional logic circuits implementing a D flip-flop, a full adder, or a multiplexer.

4. A field-programmable transistor array, comprising:
a plurality of logic cells, wherein each of the plurality of logic cells comprises a plurality of columns of transistors, wherein each of the plurality of columns of transistors comprises a plurality of first transistors and a plurality of second transistors;
wherein each of the plurality of first transistors are individually programmable to be either always on, always off, or to be controlled by a logic signal;
wherein a number of the plurality of second transistors are configured to be programmed to be always on, always off, or to be controlled by a logic signal;
a routing switch block for each logic cell in the plurality of logic cells, wherein the routing switch block comprises a plurality of routing switches; and
wherein the plurality of first switches, the plurality of second switches, and the plurality of routing switches are configured to be programmed by a plurality of parallel programming bits.

5. A field-programmable transistor array, comprising:
a plurality of logic cells, wherein each of the plurality of logic cells comprises a plurality of columns of transistors, wherein each of the plurality of columns of transistors comprises a plurality of first transistors and a plurality of second transistors;
wherein each of the plurality of first transistors are individually programmable to be either always on, always off, or to be controlled by a logic signal;
wherein a number of the plurality of second transistors are configured to be programmed to be always on, always off, or to be controlled by a logic signal;
local memory configured to store a plurality of programming bits for programming the plurality of first transistors and the plurality of second transistors for a plurality of states; and wherein the local memory is configured to be used to program the plurality of first transistors and the plurality of second transistors for a first configuration with a first plurality of programming bits stored in the local memory while a second plurality of programming bits for programming the plurality of first transistors and the plurality of second transistors for a second configuration is stored into the local memory.

6. The field-programmable transistor array of claim 5 further comprising a memory buffer pipeline configured for loading the programming bits into local memory, wherein the memory buffer pipeline comprises a plurality of hierarchically arranged memory buffers.

7. The field-programmable transistor array of claim 6, wherein the memory buffer pipeline is an asynchronous memory buffer pipeline configured for loading the programming bits asynchronously.

8. The field-programmable transistor array of claim 6, wherein each memory buffer in the plurality of hierarchically arranged memory buffers has a unique address.

9. The field-programmable transistor array of claim 1, wherein the field-programmable transistor array and standard logic cells that are configured during manufacturing comprise an integrated circuit.

10. A method of making an integrated circuit, comprising:
manufacturing an integrated circuit comprising standard logic cells that are configured during manufacturing and a field-programmable transistor array, wherein the field programmable transistor array comprises:
a plurality of logic cells, wherein each of the plurality of logic cells comprises a plurality of columns of transistors, wherein each of the plurality of columns of transistors comprises a plurality of first transistors and a plurality of second transistors;
wherein each of the plurality of first transistors are individually programmable to be either always on, always off, or to be controlled by a logic signal; and
wherein a number of the plurality of second transistors are configured to be programmed to be always on or always off or to be controlled by a logic signal; and
configuring the field-programmable transistor array after manufacturing.

11. The method of claim 10, wherein the second transistors connect the first transistors in a first column of transistors in a logic cell in the plurality of logic cells to the first transistors in a second column of transistors in the logic cell.

12. The method of claim 11, wherein:
the first transistors in the first column of transistors comprise a first two pMOS transistors connected in series with each other and a first two nMOS transistors connected in series with each other, and wherein the first two pMOS transistors are connected in series with the first two nMOS transistors;
the second transistors comprise second pMOS transistors connecting the first two pMOS transistors to pMOS transistors in the first transistors in the second column of transistors and second nMOS transistors connecting the first two nMOS transistors to nMOS transistors in the first transistors in the second column of transistors.

13. The method of claim 10, wherein the first transistors and the second transistors in the plurality of columns of transistors in a logic cell in the plurality of logic cells is programmed to configure the logic cell to implement the function of a logic gate.

14. The method of claim 10, wherein a logic cell in the plurality of logic cells further comprises additional logic circuits implementing a D flip-flop, a full adder, or a multiplexer.

15. The method of claim 10 further comprising a routing switch block for each logic cell in the plurality of logic cells, wherein the routing switch block comprises a plurality of routing switches; and
   wherein the plurality of first switches, the plurality of second switches, and the plurality of routing switches are configured to be programmed by a plurality of parallel programming bits.

16. The method of claim 10 further comprising:
   local memory configured to store a plurality of programming bits for programming the plurality of first transistors and the plurality of second transistors for a plurality of states.

17. The method of claim 16, wherein the local memory is configured to be used to program the plurality of first transistors and the plurality of second transistors for a first configuration with a first plurality of programming bits stored in the local memory while a second plurality of programming bits for programming the plurality of first transistors and the plurality of second transistors for a second configuration is stored into the local memory.

* * * * *